(12) United States Patent
Wu et al.

(10) Patent No.: US 10,187,964 B2
(45) Date of Patent: Jan. 22, 2019

(54) CALIBRATING APPARATUS AND METHOD

(71) Applicant: Semiconductor Manufacturing International (Shanghai) Corporation, Shanghai (CN)

(72) Inventors: Qiang Wu, Shanghai (CN); Liwan Yue, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 15/967,852

(22) Filed: May 1, 2018

(65) Prior Publication Data

US 2018/0255630 A1 Sep. 6, 2018

Related U.S. Application Data

(62) Division of application No. 14/883,801, filed on Oct. 15, 2015, now Pat. No. 9,992,857.

(30) Foreign Application Priority Data

Oct. 16, 2014 (CN) .......................... 2014 1 0548939

(51) Int. Cl.
*G01J 1/42* (2006.01)
*H05G 2/00* (2006.01)
*G03F 7/20* (2006.01)

(52) U.S. Cl.
CPC ......... *H05G 2/006* (2013.01); *G03F 7/70033* (2013.01); *H05G 2/005* (2013.01); *H05G 2/008* (2013.01)

(58) Field of Classification Search
CPC .. G03F 7/201; G03F 7/70066; G03F 7/70191; G03F 7/70358
See application file for complete search history.

(56) References Cited

U.S. PATENT DOCUMENTS 8,143,606 B2    3/2012 Komori et al.
9,529,276 B2 *  12/2016 Mann .................. G03F 7/70191
2003/0138742 A1 * 7/2003 Irie .......................... G03F 7/201
                                                                    430/396

FOREIGN PATENT DOCUMENTS

GB          219438 A   *  7/1924  ......... H05B 31/0072
KR      100809329 B1  *  3/2008  ............. B82Y 10/00

* cited by examiner

*Primary Examiner* — Kiho Kim
(74) *Attorney, Agent, or Firm* — Anova Law Group, PLLC

(57) ABSTRACT

Calibrating apparatus and method for correcting aberrations in an extreme ultraviolet (EUV) light source are provided. A calibrating apparatus includes an illuminant positioned at a radiating position, including a plurality of light sources arranged along a straight scanning direction, the plurality of light sources emitting light sequentially; a condenser stage configured to carry a to-be-corrected condenser mirror and drive the to-be-corrected condenser mirror to rotationally scan so that a reflective ellipsoidal surface of the to-be-corrected condenser mirror collects light emitted by the light sources and converge collected light at a center of focus through reflection; and an array detector positioned at the center of focus configured to detect light reflected by the to-be-corrected condenser mirror to obtain a detection spot, the array detector including a standard center point overlapping with the center of focus for comparing a position difference between the detection spot and the standard center point.

14 Claims, 12 Drawing Sheets

CALIBRATING APPARATUS AND METHOD

CROSS-REFERENCES TO RELATED APPLICATIONS

This application is a divisional of U.S. patent application Ser. No. 14/883,801, filed on Oct. 15, 2015, which claims the priority of Chinese Patent Application No. 201410548939.1 filed on Oct. 16, 2014, the entire content of all of which is incorporated herein by reference.

FIELD OF THE DISCLOSURE

The present disclosure relates to the field of semiconductor technology and, more particularly, relates to calibrating apparatus and method.

BACKGROUND

Photolithography is a critical step in semiconductor fabrication. Photolithography often includes the use of exposure and development in photoresist layers for forming photolithography patterns. However, the advances in integration level of chips require continuous decrease in feature size of photolithography process.

The resolution (R) of the exposure device determines the minimal feature size of the photolithography process. The resolution (R) of the exposure system or device may satisfy the relationship of R=kλ/(NA), where k represents a parameter associated with the exposure process, λ represents the wavelength of the light source used for exposure, NA represents the numerical aperture of the optical system in the exposure device. It can be shown from the relationship described above that, the resolution of the exposure device can be increased in two ways. One way is to increase the numerical aperture of the optical system, and the other way is to decrease the wavelength of the light source used for exposure.

Efforts have been made to increase the resolution by increasing the numerical aperture of the optical system. However, because the next-generation photolithography process may have considerably demanding requirements on the minimal feature size, a sufficiently large numerical aperture needs to be provided optically to satisfy the requirements. The large numerical aperture not only makes the photolithography device and the related modulation undesirably complex, but also greatly limits the depth of focus of the optical system.

Thus, the other way to increase the resolution, i.e., decreasing the wavelength of the light source used for exposure, has been studied. Extreme ultraviolet (EUV) light source is a newly developed light source. The wavelength of light for exposure, generated by the EUV light source, may be about 13.5 nm or even shorter. Applying the EUV light in the exposure system may obtain desirably small photolithography feature size.

In conventional technology, a main method used for generating EUV light is laser produced plasma (LPP). The working principle of the LLP includes using a laser source to generate a laser beam and using the generated laser beam to bombard tin (Sn) targets. The bombardment excites plasma, and the plasma radiates EUV light.

As shown in FIG. 1, the structure of a conventional EUV light source includes a tin droplet nozzle 101, a laser source 103, a lens unit 105, and a condenser mirror 107. The tin droplet nozzle 101 ejects tin droplets 102 downward intermittently. The laser source 103 is configured to generate a laser beam 104. After converged by the lens unit 105, the laser beam 104 bombards the tin droplets 102. The bombarded tin droplets 102 generate plasma, and the generated plasma radiates EUV light 108. The condenser mirror 107 is configured to collect the radiated EUV light 108 and converge the radiated EUV at the center of focus 109.

However, the EUV light generated by the conventional EUV light source has undesirably low power, which cannot meet the requirements of mass production. The disclosed device structures and methods are directed to solve one or more problems set forth above and other problems.

BRIEF SUMMARY OF THE DISCLOSURE

One aspect of the present disclosure provides an extreme ultraviolet (EUV) light source. The EUV light source includes a droplet array with a plurality of nozzles arranged along a straight scanning direction, the plurality of nozzle sequentially and intermittently ejecting droplets downward to a radiating position; a laser source configured to generate at least two laser beams and scan the at least two laser beams along the straight scanning direction, the at least two laser beams alternately bombarding droplets arriving at the radiating position to form EUV light; and a condenser with a condenser mirror having a reflective ellipsoidal surface, configured to collect the EUV light and converge collected EUV light at a center of focus. The condenser mirror includes one or more first side regions, one or more central regions, and one or more second side regions arranged along a rotational scanning direction, each central region being positioned between one first side region on one side and one second side region on another side, each first side region having a first offset value towards an inner direction of the reflective ellipsoidal surface, and each second side region having a first offset value towards an outer direction of the reflective ellipsoidal surface.

Another aspect of the present disclosure provides a photolithography apparatus. The photolithography apparatus includes the disclosed extreme ultraviolet (EUV) light source.

Another aspect of the present disclosure provides a calibrating apparatus for correcting aberrations in an extreme ultraviolet (EUV) light source. The apparatus includes an illuminant positioned at a radiating position, including a plurality of light sources arranged along a straight scanning direction, the plurality of light sources emitting light sequentially; a condenser stage configured to carry a to-be-corrected condenser mirror and drive the to-be-corrected condenser mirror to rotationally scan so that a reflective ellipsoidal surface of the to-be-corrected condenser mirror collects light emitted by the light sources and converge collected light at a center of focus through reflection; and an array detector positioned at the center of focus configured to detect light reflected by the to-be-corrected condenser mirror to obtain a detection spot, the array detector including a standard center point overlapping with the center of focus for comparing a position difference between the detection spot and the standard center point.

Another aspect of the present disclosure provides a calibrating method for correcting aberrations in an extreme ultraviolet (EUV) light source. The calibrating method includes providing a to-be-corrected condenser mirror with a reflective ellipsoidal surface, wherein the to-be-corrected condenser mirror includes one or more first side regions, one or more central regions, and one or more second side regions arranged according to a rotational scanning direction, a central region being arranged between a first side region on one side and a second side region on another side, and the second side region may be positioned on the other side of the central region; providing an illuminant positioned at a radiating position of the EUV light source, the illuminant including a plurality of light source arranged along a straight scanning direction for emitting light to the reflective ellipsoidal surface of the to-be-corrected condenser mirror; and providing an array detector may at a center of focus configured to detect light reflected by the reflective ellipsoidal surface of the to-be-corrected condenser mirror, the array detector including a standard center point overlapping with the center of focus. The calibrating method also includes setting a first test offset value corresponding to a first side region of the to-be-corrected condenser mirror and a second test offset value corresponding to a second side region of the to-be-corrected condenser mirror, wherein the first test offset value is an offset along an inward direction with respect to the reflective ellipsoidal surface of the to-be-corrected condenser mirror and the second test offset value is an offset along an outward direction with respect to the reflective ellipsoidal surface of the to-be-corrected condenser mirror.

Other aspects or embodiments of the present disclosure can be understood by those skilled in the art in light of the description, the claims, and the drawings of the present disclosure

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
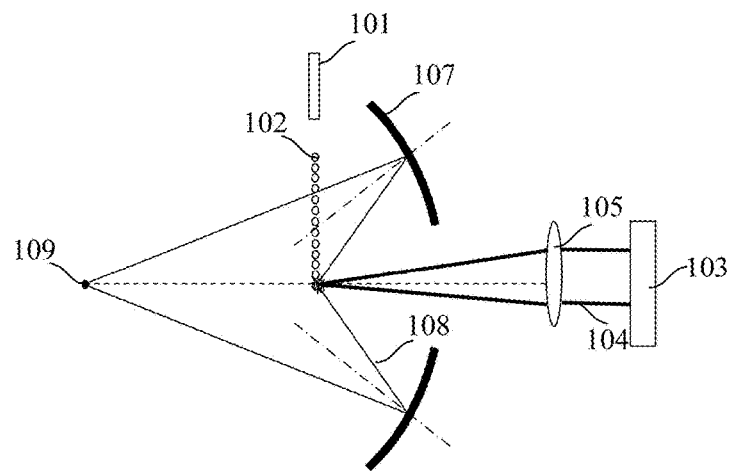
FIG. 1 illustrates the structure of a conventional EUV light source.

As described in the background, the EUV light generated by the conventional EUV light source has undesirably low power, e.g., often about 10 W to about 30 W. In an actual photolithography process, the power of the light source is often required to reach up to 250 W. The EUV light generated by a conventional EUV light source is not able to meet the requirements of actual mass production.

According to the present disclosure, the ejection of tin droplets from the tin droplet nozzle in a conventional EUV light source is controlled by mechanical means so that adjacent tin droplets are spatially separated. The laser beam may bombard each tin droplet. Each tin droplet forms plasma during the bombardment. The plasma radiates EUV light.

If the distance between two adjacent tin droplets is too small or two adjacent tin droplets are merged together, when the laser beam bombards the present tin droplet, the formed plasma fragments may affect the next tin droplet and cause inferior bombardment or difficulty in collecting the radiated EUV. The output power of the EUV light source may be affected. To ensure the integrity of each tin droplet and a desired distance between two adjacent tin droplets, the ejection frequency of the nozzle for tin droplets ejection, controlled by a mechanical means, has a limit of about 100 k Hz.

Thus, the number of tin droplets ejected by the tin droplet nozzle within a unit of time is limited. The number of tin droplets bombarded by the laser beam is also limited. The plasma generated by the bombarded tin droplets and the EUV light radiated by the generated plasma are also limited. As a result, the amount of EUV light converged at the center of focus within a unit of time is limited, and the output power of the EUV light converged at the center of focus is undesirably low.

To solve such problems, the present disclosure provides an EUV light source. The EUV light source includes a droplet array, a laser source, and a condenser. The droplet array includes a plurality of nozzles arranged along a straight scanning direction. The plurality of nozzles sequentially ejects droplets downward to a radiating position. The laser beam is configured to generate laser beams and scan the laser beams along a straight direction. The laser beams alternately bombards the droplets that arrive at the radiating position. A droplet is bombarded by a first laser beam or a second laser beam for forming plasma. The plasma radiates EUV light.

The condenser includes a condenser mirror and a first driving mechanism connected to the condenser mirror. The first driving mechanism is configured to drive or steer the rotational scanning of the condenser mirror, so that the condenser mirror can collect the radiated EUV light and converge the collected EUV light at the center of focus. The condenser mirror has a reflective surface with an ellipsoidal shape. The reflective surface with the ellipsoidal shape may be referred as a reflective ellipsoidal surface. The condenser mirror includes a first side region and a second side region facing the first side region. The first side region of the condenser mirror has a first offset value towards the inner side of the ellipsoidal surface. The second side region of the condenser mirror has a second offset value towards the outer side of the ellipsoidal surface. In this disclosure, a driving mechanism may be any suitable mechanism, structure, device, unit, or the like that is capable of providing driving force to a desired part according to the embodiments. For example, a driving mechanism may be a motor or an actuator.

The droplet array includes a plurality of nozzles. The plurality of nozzles sequentially ejects droplets downward to the radiating position. The supply of droplets within a unit of time can be improved. The laser beams scan the droplets along a straight direction and sequentially bombards the droplet arriving the radiating position to generate EUV light. Thus, no droplets arriving at the radiating position is wasted. The amount of EUV light generated can be increased.

Meanwhile, the condenser rotationally scans the droplets and collects the radiated EUV light generated from the bombardment of different droplets. The condenser further converges the collected EUV light at the center of focus so that the output power of EUV light at the center of focus increases. In addition, the first side region of the condenser mirror has a first offset value towards the inner side of the ellipsoidal surface and the second side region of the condenser mirror has a second offset value towards the outer side of the ellipsoidal surface.

During the rotational scanning of the condenser mirror, contained in the condenser, the first offset value may be used to compensate the elastic deformation of the first side region along an outward direction with respect to the ellipsoidal surface, and the second offset value may be used to compensate the elastic deformation of the second side region along an inward direction with respect to the ellipsoidal surface. The surface of the condenser mirror can thus be kept an ideal ellipsoidal surface during the scanning process, and the collected EUV light can be converged at the same center of focus after being reflected by the reflective surface of the condenser mirror. The output power of the EUV light at the center of focus can be increased or improved.

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention. For illustrative purposes, portions of the parts in the drawings may be enlarged according to a necessary ratio. The drawings are only illustrations of the present disclosure and are thus not limited by the disclosed embodiments. In addition, in practice, the fabrication should include three dimensional features, i.e., the length, width, and depth.

Figure 2:
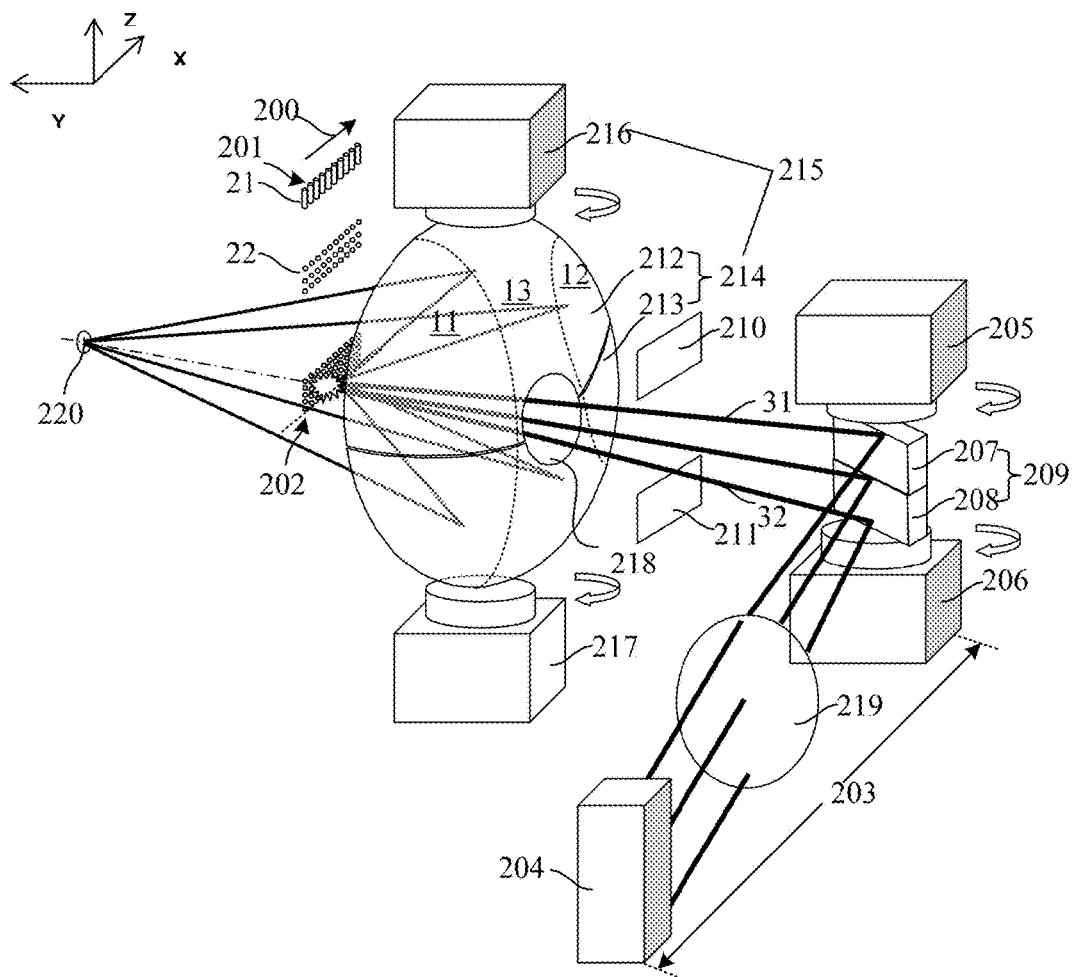
FIG. 2 illustrates the structure of an exemplary EUV light source consistent with the disclosed embodiments of the present disclosure.

As shown in FIG. 2, the structure of an exemplary EUV light source is provided. The EUV light source may include a droplet array 201, a laser source 203, and a condenser 215. The droplet array 201 may include a plurality of nozzles 21 arranged along a straight scanning direction 200. The plurality of nozzles 21 may be configured to eject droplets 22 downward to the radiating position 202. The laser source 203 may be configured to generate laser beams 31 and 32, and scan the laser beams 31 and 32 along a straight line. The laser beams 31 and 32 may sequentially bombard the droplets 22 at the radiating position 202. The droplets 22 may be bombarded by the laser beams and form plasma, which radiates EUV light.

The condenser 215 may include a condenser mirror 214 and a first driving mechanism connected with the condenser mirror. The first driving mechanism is configured to drive the condenser mirror 214 to rotationally scan, so that the condenser mirror 214 may collect the radiated EUV light and converge the collected EUV light at the center of focus 220. The condenser mirror 214 may have a reflective surface with an ellipsoidal shape, which can be referred as a reflective ellipsoidal surface. The condenser mirror 214 may include first side regions, central regions, and second side regions. A first side region may be positioned on one side of a corresponding central region and a second side region may be positioned on the other side of the corresponding central region. A first side region of the condenser mirror may have a first offset value towards the inner side of the ellipsoidal surface. A second side region of the condenser mirror may have a second offset value towards the outer side of the ellipsoidal surface.

The laser source 203 may include a laser 204, a reflector 209, and a second driving mechanism. The reflector 209 may include a first reflector 207 and a second reflector 208, separated from each other. The second driving mechanism may include a third sub-driving mechanism 205 and a fourth sub-driving mechanism 206. The first reflector 207 may be positioned atop of the second reflector 208. The first reflector 207 may reflect a portion of the laser beam to form the first laser beam 31. The third sub-driving mechanism 205 may be connected with the first reflector 207. The third sub-driving mechanism 205 may drive the first reflector 207 to rotate so that the first laser beam 31 may scan the droplets 22 along the straight scanning direction 200. The first laser beam 31 may sequentially bombard the droplets 22 at the radiating position 202. The second reflector 208 may reflect another portion of the laser beam to form the second laser beam 32. The fourth sub-driving mechanism 206 may be connected with the second reflector 208. The fourth sub-driving mechanism 206 may drive the second reflector 208 to rotate so that the second laser beam 32 may scan the droplets 22 along the straight scanning direction 200. The second laser beam 32 may sequentially bombard the droplets 22 at the radiating position 202.

The condenser mirror 214 may include an upper portion condenser mirror 212 and a lower portion condenser mirror 213, separated from each other. The upper portion condenser mirror 212 may be positioned atop the lower portion condenser mirror 213. The first driving mechanism may include a first sub-driving mechanism 216 and a second sub-driving mechanism 217. The first sub-driving mechanism 216 may be connected with the upper portion condenser mirror 212 to drive the upper portion condenser mirror 212 to rotationally scan, so that the upper portion condenser mirror 212 may collect the radiated EUV light when the first laser beam 31 bombards a droplet. The upper portion condenser mirror 212 may converge the collected EUV light at the center of focus 220.

The second sub-driving mechanism 217 may be connected to the lower portion condenser mirror 213 to drive the lower portion condenser mirror 213 to rotationally scan, so that the lower portion condenser mirror 213 may collect the radiated EUV light when the second laser beam 32 bombards a droplet. The lower portion condenser mirror 213 may converge the collected EUV light at the center of focus 220.

In one embodiment, the condenser mirror 214 may have a reflective surface with an ellipsoidal shape, referred as a reflective ellipsoidal surface. The reflective ellipsoidal surface may include the upper portion condenser mirror 212 and the lower portion condenser mirror 213, symmetric to each other. The upper portion condenser mirror 212 and the lower portion condenser mirror 213 may each have half of the reflective ellipsoidal surface.

Along the straight scanning direction 200, the upper portion condenser mirror 212 and the lower portion condenser mirror 213 may each include a first side region, a central region, and a second side region. The first side region may be positioned on one side of the corresponding central region and the second side region may be positioned on the other side of the corresponding central region. The first sub-driving mechanism 216 and the upper portion condenser mirror 212 may be connected through the top of the central region of the upper portion condenser mirror 212. The second sub-driving mechanism 217 and the lower portion condenser mirror 213 may be connected through the bottom of the central region of the lower portion condenser mirror 213.

In other embodiments of the present disclosure, the first sub-driving mechanism 216 and the upper portion condenser mirror 212 may be connected through the back of the central region of the upper portion condenser mirror 212. The second sub-driving mechanism 217 and the lower portion condenser mirror 213 may be connected through the back of the central region of the lower portion condenser mirror 213.

When the first sub-driving mechanism 216 drives the upper portion condenser mirror 212 to rotationally scan, the first side region and the second side region of the upper portion condenser mirror 212 may undergo elastic deformation as a result of centrifugal force. When the second sub-driving mechanism 217 drives the lower portion condenser mirror 213 to rotationally scan, the first side region and the second side region of the lower portion condenser mirror 213 may undergo elastic deformation as a result of centrifugal force. The side regions of the reflective ellipsoidal surfaces of the upper portion condenser mirror 212 and the lower portion condenser mirror 213 may deviate from the ideal positions, and the upper portion condenser mirror 212 and the lower portion condenser mirror 213 may not be able to collect EUV light and converge the collected EUV light at the center of focus 220.

In one embodiment, the first side regions of the upper portion condenser mirror 212 and the lower portion condenser mirror 213 may each have a first offset value towards the inner side of the ellipsoidal surface to compensate the elastic deformation of the first side regions along the outward direction with respect to the ellipsoidal surface when the upper portion condenser mirror 212 and the lower portion condenser mirror 213 are rotationally scanning. The second side regions of the upper portion condenser mirror 212 and the lower portion condenser mirror 213 may each have a second offset value towards the outer side of the ellipsoidal surface to compensate the elastic deformation of the second side regions along the inward direction with respect to the ellipsoidal surface when the upper portion condenser mirror 212 and the lower portion condenser mirror 213 are rotationally scanning.

In one embodiment, as shown in FIG. 2, the straight scanning direction 200 may be the positive direction of X-axis, the upper portion condenser mirror 212 and the lower portion condenser mirror 213 may rotationally scan along a clockwise direction (top view). The first reflector 207 and the second reflector 208 may also rotationally scan along a clockwise direction. A portion of the upper portion condenser mirror 212 below the bottom of the first sub-driving mechanism 216 may be defined as the central region 13; a portion of the upper portion condenser mirror 212 at the left lower side of the first sub-driving mechanism 216 may be defined as the first side region 11; and a portion of the upper portion condenser mirror 212 at the right lower side of the first sub-driving mechanism 216 may be defined as the second side region 12.

Similarly, a portion of the lower portion condenser mirror 213 above the top of the second sub-driving mechanism 217 may be defined as the central region 13; a portion of the lower portion condenser mirror 213 at the left upper side of the second sub-driving mechanism 217 may be defined as the first side region 11; and a portion of the lower portion condenser mirror 213 at the right upper side of the second sub-driving mechanism 217 may be defined as the second side region 12. When the upper portion condenser mirror 212 and the lower portion condenser mirror 213 are rotationally scanning along the clockwise direction, the first side region 11 may undergo elastic deformation along the outward direction with respect to the ellipsoidal surface, and the second side region 12 may undergo elastic deformation along the inward direction with respect to the ellipsoidal surface.

In one embodiment, the first side regions 11 of the upper portion condenser mirror 212 and the lower portion condenser mirror 213 may each have the first offset value towards the inner side of the ellipsoidal surface to compensate the elastic deformation of the first side regions 11 along the outward direction with respect to the ellipsoidal surface; and the second regions 12 of the upper portion condenser mirror 212 and the lower portion condenser mirror 213 may each have the second offset value towards the outer side of the ellipsoidal surface to compensate the elastic deformation of the second side regions 12 along the inward direction with respect to the ellipsoidal surface.

In another embodiment, the straight scanning direction 200 may be the negative direction of X-axis (referring to the coordinates in FIG. 2), the upper portion condenser mirror 212 and the lower portion condenser mirror 213 may rotationally scan along a counterclockwise direction (top view). The first reflector 207 and the second reflector 208 may also rotationally scan along a counterclockwise direction. A portion of the upper portion condenser mirror below the bottom of the first sub-driving mechanism may be defined as the central region; a portion of the upper portion condenser mirror at the right lower side of the first sub-driving mechanism may be defined as the first side region; and a portion of the upper portion condenser mirror at the left lower side of the first sub-driving mechanism may be defined as the second side region.

Similarly, a portion of the lower portion condenser mirror above the top of the second sub-driving mechanism may be defined as the central region; a portion of the lower portion condenser mirror at the right upper side of the second sub-driving mechanism may be defined as the first side region; and a portion of the lower portion condenser mirror at the left upper side of the second sub-driving mechanism may be defined as the second side region. When the upper portion condenser mirror and the lower portion condenser mirror are rotationally scanning along the counterclockwise direction, the first side region may undergo elastic deformation along the outward direction with respect to the ellipsoidal surface, and the second side region may undergo elastic deformation along the inward direction with respect to the ellipsoidal surface.

Thus, the first side regions of the upper portion condenser mirror and the lower portion condenser mirror may each have the first offset value towards the inner side of the ellipsoidal surface to compensate the elastic deformation of the first side regions along the outward direction with respect to the ellipsoidal surface; and the second regions of the upper portion condenser mirror and the lower portion condenser mirror may each have the second offset value towards the outer side of the ellipsoidal surface to compensate the elastic deformation of the second side regions along the inward direction with respect to the ellipsoidal surface.

It should be noted that, definitions and descriptions of the parts of the EUV light source in the disclosed embodiments may be referred to definitions and descriptions of the same or like parts in the subsequent embodiments.

In one embodiment, the condenser mirror of the EUV light source may include separated upper portion condenser mirror 212 and lower portion condenser mirror 213. The upper portion condenser mirror 212 may be positioned atop the lower portion condenser mirror 213. The first driving mechanism may include a first sub-driving mechanism 216 and a second sub-driving mechanism 217. The first sub-driving mechanism 216 may be connected with the upper portion condenser mirror 212 to drive the upper portion condenser mirror 212 to rotationally scan. The second sub-driving mechanism 217 may be connected with the lower portion condenser mirror 213 to drive the lower portion condenser mirror 213 to rotationally scan. The condenser mirror may have an ellipsoidal shape.

When the first sub-driving mechanism 216 is connected to the upper portion condenser mirror 212, the first sub-driving mechanism 216 may only be connected to a portion of the upper portion condenser mirror 212. When the second sub-driving mechanism 217 is connected to the lower portion condenser mirror 213, the second sub-driving mechanism 217 may only be connected to a portion of the lower portion condenser mirror 213.

In practice, because the rotational scanning speed of the condenser mirror can be very high, when the first sub-driving mechanism 216 provides a driving force to the upper portion condenser mirror 212, the transport of the driving force to the upper portion condenser mirror 212 may require a transport period. When the portion of the upper portion condenser mirror 212 connected to the first sub-driving mechanism 216 starts to rotate, the rest portions of the upper portion condenser mirror 212 may lag for a certain period before starting to rotate.

Similarly, when the portion of the lower portion condenser mirror 213 connected to the second sub-driving mechanism 217 starts to rotate, the rest portions of the lower portion condenser mirror 213 may lag for a certain period before starting to rotate. That is, different parts of portions of the upper portion condenser mirror 212 and the lower portion condenser mirror 213 may start rotational scanning at different times. Thus, when the upper portion condenser mirror 212 and the lower portion condenser mirror 213 are collecting EUV light, it may be difficult to converge the collected EUV light, through reflection, at the same center of focus 220. The power of the EUV light at the center of focus 220 may be decreased.

Figure 3:
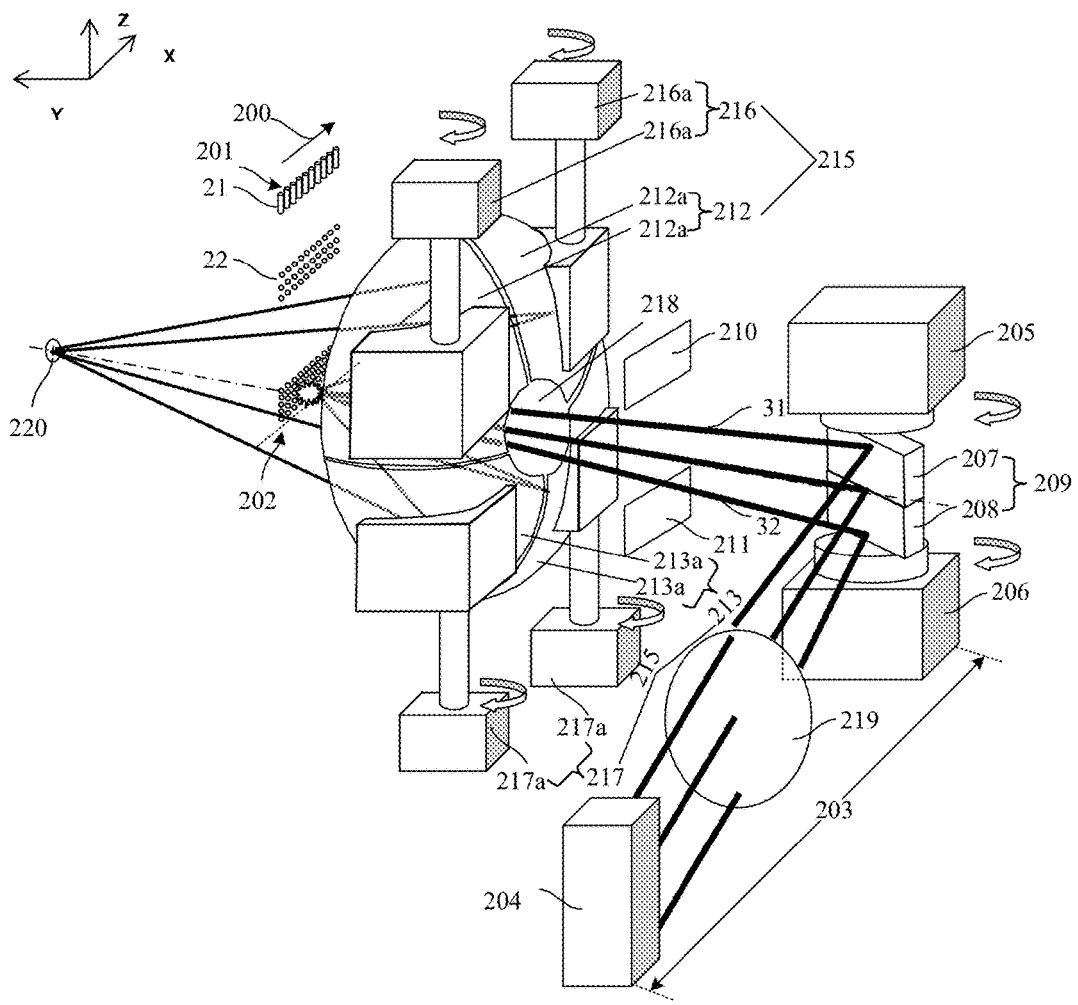
FIGS. 3 to 5 illustrate the structure of another exemplary EUV light source consistent with the disclosed embodiments of the present disclosure.

Thus, embodiments of the present disclosure further include an EUV light source, as shown in FIG. 3. The EUV light source may include a droplet array 201, a laser source 203, and a condenser 215. The droplet array 201 may include a plurality of nozzles 21 arranged along a straight scanning direction 200. The plurality of nozzles 21 may be configured to eject droplets 22 downward to the radiating position 202. The laser source 203 may be configured to generate laser beams, i.e., a first laser beam 31 and a second laser beam 32, and scan the first laser beam 31 and the second laser beam 32 along the straight scanning direction 200. The laser beams may alternately bombard droplets, of different rows, arriving at the radiating position 202. A droplet may be bombarded by the first laser beam 31 or the second laser beam 32 to form plasma, which radiates EUV light.

The condenser 215 may include a condenser mirror and a first driving mechanism connected with the condenser mirror. The first driving mechanism may be configured to drive the condenser mirror to rotationally scan so that the condenser mirror may collect the radiated EUV light and converge the collected EUV light at the center of focus 220. The condenser mirror may have a reflective surface with an ellipsoidal shape, referred as a reflective ellipsoidal surface. The condenser mirror may include separated upper portion condenser mirror 212 and lower portion condenser mirror 213.

The upper portion condenser mirror 212 may be positioned atop the lower portion condenser mirror 213. The upper portion condenser mirror 212 may include at least two separated first sub-condenser mirrors 212a, and the lower portion condenser mirror 213 may include at least two separated sub-condenser mirrors 213a.

The first driving mechanism may include at least two first sub-driving mechanism 216a and at least two second sub-driving mechanism 217a. Each first sub-driving mechanism 216a may be connected with a first sub-condenser mirror 212a, and each second sub-driving mechanism 217a may be connected with a second sub-condenser mirror 213a. The at least two first sub-driving mechanism 216a may drive the corresponding at least two first sub-condenser mirrors 212a to rotationally scan simultaneously.

The at least two second sub-driving mechanism 217a may drive the corresponding at least two second sub-condenser mirrors 213a to rotationally scan simultaneously. Each one of the first sub-condenser mirrors 212a and the second sub-condenser mirrors 213a may include a first side region, a central region, and a second side region arranged along the direction of the rotational scanning. A first side region may be positioned on one side of a corresponding central region and a second side region may be positioned on the other side of the corresponding central region. The first side region may have a first offset value towards the inner side of the ellipsoidal surface, and the second side region may have a second offset value towards the outer side of the ellipsoidal surface.

In one embodiment, the first side region of each one of the first sub-condenser mirrors 212a and each one of the second sub-condenser mirrors 213a may have a first offset value towards the inner side of the ellipsoidal surface to compensate the elastic deformation of the first side region of each first sub-condenser mirror 212a and of each second sub-condenser mirror 213a along the outward direction with respect to the ellipsoidal surface during the rotational scanning.

The second side region of each one of the first sub-condenser mirrors 212a and each one of the second sub-condenser mirrors 213a may have a second offset value towards the outer side of the ellipsoidal surface to compensate the elastic deformation of the second side region of each first sub-condenser mirror 212a and of each second sub-condenser mirror 213a along the inward direction with respect to the ellipsoidal surface during the rotational scanning. Thus, the reflective ellipsoidal surface of the condenser mirror may be positioned at an ideal position during the rotational scanning, and may converge the collected EUV light at the same center of focus 220 through reflection.

In one embodiment, when the number of the first sub-condenser mirrors 212a (or the number of the second sub-condenser mirrors 213a) is greater than 2, the reflective surface of a first sub-condenser mirror 212a (or the second sub-condenser mirror 213a) at the central position may have a sufficiently small arc. When rotationally scanning, the elastic deformation of the first sub-condenser mirror 212a (or the second sub-condenser mirror 213a) at the central position may be lower than the elastic deformation of a first sub-condenser mirror 212 (or a second sub-condenser mirror 213a) on a side position.

Thus, the first side region of a first sub-condenser mirror 212a (or a second sub-condenser mirror 213a) at the central position may have a smaller first offset value than a first side region of a first sub-condenser mirror 212a (or a second sub-condenser mirror 213a) on a side position; and the second side region of a first sub-condenser mirror 212a (or a second sub-condenser mirror 213a) at the central position may have a smaller second offset value than a second side region of a first sub-condenser mirror 212a (or a second sub-condenser mirror 213a) at a side position.

In another embodiment, the first side region of a first sub-condenser mirror 212a (or a second sub-condenser mirror 213a) at the central position may have a first offset value of zero; and the second side region of a first sub-condenser mirror 212a (or a second sub-condenser mirror 213a) at the central position may have a second offset value of zero. A first side region of a first sub-condenser mirror 212a (or a second sub-condenser mirror 213a) on a side position may have a first offset value greater than zero; and a second side region of a first sub-condenser mirror 212a (or a second sub-condenser mirror 213a) on a side position may have a second offset value greater than zero.

In one embodiment, as shown in FIG. 3, the straight scanning direction 200 may be the positive direction of X axis. The upper portion condenser mirror 212 and the lower portion condenser mirror 213 may rotationally scan along a clockwise direction (top view); and the first reflector 207 and the second reflector 208 may rotationally scan along a clockwise direction. A portion of the first sub-condenser mirror 212a below the bottom of a first sub-driving mechanism 216a may be defined as a central region; a portion of the first sub-condenser mirror 212 positioned at the left lower side of a first sub-driving mechanism 216 may be defined as a first side region; and a portion of the first sub-condenser mirror 212 positioned at the right lower side of a first sub-driving mechanism 216a may be defined as a second side region.

Similarly, a portion of the second sub-condenser mirror 213a above the top of a first sub-driving mechanism 216 may be defined as a central region; a portion of the second sub-condenser mirror 212 positioned at the left upper side of a second sub-driving mechanism 217 may be defined as a first side region; and a portion of the first sub-condenser mirror 212 positioned at the right upper side of a first sub-driving mechanism 216a may be defined as a second side region. When the first sub-condenser mirrors 212a and the second sub-condenser mirrors 213a are rotationally scanning along the clockwise direction, the first side regions may undergo elastic deformation along the outward direction with respect to the ellipsoidal surface, and the second side regions may undergo elastic deformation along the inward direction with respect to the ellipsoidal surface.

Thus, in one embodiment, the first side regions of the first sub-condenser mirrors 212a and the second sub-condenser mirrors 213a may each have a first offset value towards the inner side of the ellipsoidal surface to compensate the elastic deformation of the first side regions along the outward direction with respect to the ellipsoidal surface; and the second side regions of the first sub-condenser mirrors 212a and the second sub-condenser mirrors 213a may each have a second offset value towards the outer side of the ellipsoidal surface to compensate the elastic deformation of the second side regions along the inward direction with respect to the ellipsoidal surface.

In another embodiment, the straight scanning direction 200 may be the negative direction of X axis (referring to the coordinates in FIG. 2). The upper portion condenser mirror and the lower portion condenser mirror may rotationally scan along a counterclockwise direction (top view); and the first reflector and the second reflector may rotationally scan along a counterclockwise direction. A portion of the first sub-condenser mirror below the bottom of a first sub-driving mechanism may be defined as a central region; a portion of the first sub-condenser mirror positioned at the left lower side of a second sub-driving mechanism may be defined as a first side region; and a portion of the first sub-condenser mirror positioned at the right lower side of a first sub-driving mechanism may be defined as a first side region.

Similarly, a portion of the second sub-condenser mirror above the top of a first sub-driving mechanism may be defined as a central region; a portion of the second sub-condenser mirror positioned at the left upper side of a second sub-driving mechanism may be defined as a second side region; and a portion of the first sub-condenser mirror positioned at the right upper side of a first sub-driving mechanism may be defined as a first side region. When the first sub-condenser mirrors and the second sub-condenser mirrors are rotationally scanning along the counterclockwise direction, the first side regions may undergo elastic deformation along the outward direction with respect to the ellipsoidal surface, and the second side regions may undergo elastic deformation along the inward direction with respect to the ellipsoidal surface.

Thus, in one embodiment, the first side regions of the first sub-condenser mirrors and the second sub-condenser mirrors may each have a first offset value towards the inner side of the ellipsoidal surface to compensate the elastic deformation of the first side regions along the outward direction with respect to the ellipsoidal surface; and the second side regions of the first sub-condenser mirrors and the second sub-condenser mirrors may each have a second offset value towards the outer side of the ellipsoidal surface to compensate the elastic deformation of the second side regions along the inward direction with respect to the ellipsoidal surface.

The droplet array 201 may include a plurality of nozzles 21. The EUV light source may further include a raw material supply chamber (not shown) for the droplets. The raw material supply chamber may be used to store the raw material used for the droplets. The plurality of nozzles 21 may be connected to the raw material supply chamber through certain tubes or pipes in between. The raw material of the droplets, stored in the raw material supply chamber, may be ejected through the nozzles 21. In other embodiments of the present disclosure, a plurality of raw material supply chambers may be included, and a plurality of nozzles may be connected to a corresponding raw material supply chamber through a pipe in between.

The droplet array 201 may also include a plurality of switches corresponding to the plurality of nozzles 21. Each switch may be used to control the on (i.e., ejection of droplets) and off (i.e., no ejection of droplets) states of the nozzles 21. The switches may be arranged the pipes connecting the nozzles 21 and the raw material of the droplets. By controlling the on (or closed) and off (or open) states of the switches, the on and off states of the droplets, in the nozzles 21 and the pipes, can be controlled, so that each nozzle 21 may eject droplets 22 intermittently downward to the radiating position 202.

The switches may be mechanical switches controlled by suitable signals, e.g., electrical signals. By controlling the electrical signals, the switches may be controlled to be closed or open, so that the nozzles 21 may be controlled to eject droplets or not to eject droplets. In one embodiment, the switches may be electronic squeeze switches. The number of nozzles 21 may be equal to or greater than 2.

The droplets may be formed from tin, tin alloy, tin compound, lithium and/or xenon. The tin compound may be $SnBr_4$, $SnBr_2$, and/or $SnH_4$. The tin alloy may be gallium—tin alloy, indium—tin alloy, and/or tin—indium—gallium alloy. According to different materials selected for forming the droplets, the temperature of the droplets 22 at the radiating position 202 may be different or same.

The distance between the plurality of nozzles and the radiating position may be subjected to different applications and/or designs, and should not be limited by the embodiments of the present disclosure.

In one embodiment, the straight scanning direction 200 may be parallel to the X axis. The radiating position 202 may be directly below the droplet array 201 and may be positioned along a straight line parallel to the direction (the straight scanning direction 200) along which the plurality of nozzles 21 are arranged. Also, the radiating position 202 may correspond to the first focal point of the reflective ellipsoidal surface of condenser mirror. The center of focus 220 may correspond to the second focal point of the reflective ellipsoidal surface of condenser mirror. The position of the first focal point may change according to a straight line parallel to the straight scanning direction 200. When the position of the first focal point changes, the condenser mirror may rotationally scan so that the position of the second focal point of the reflective ellipsoidal surface may stay unchanged or stable. In other embodiments of the present disclosure, other ways of scanning may also be defined or used.

Figure 4:
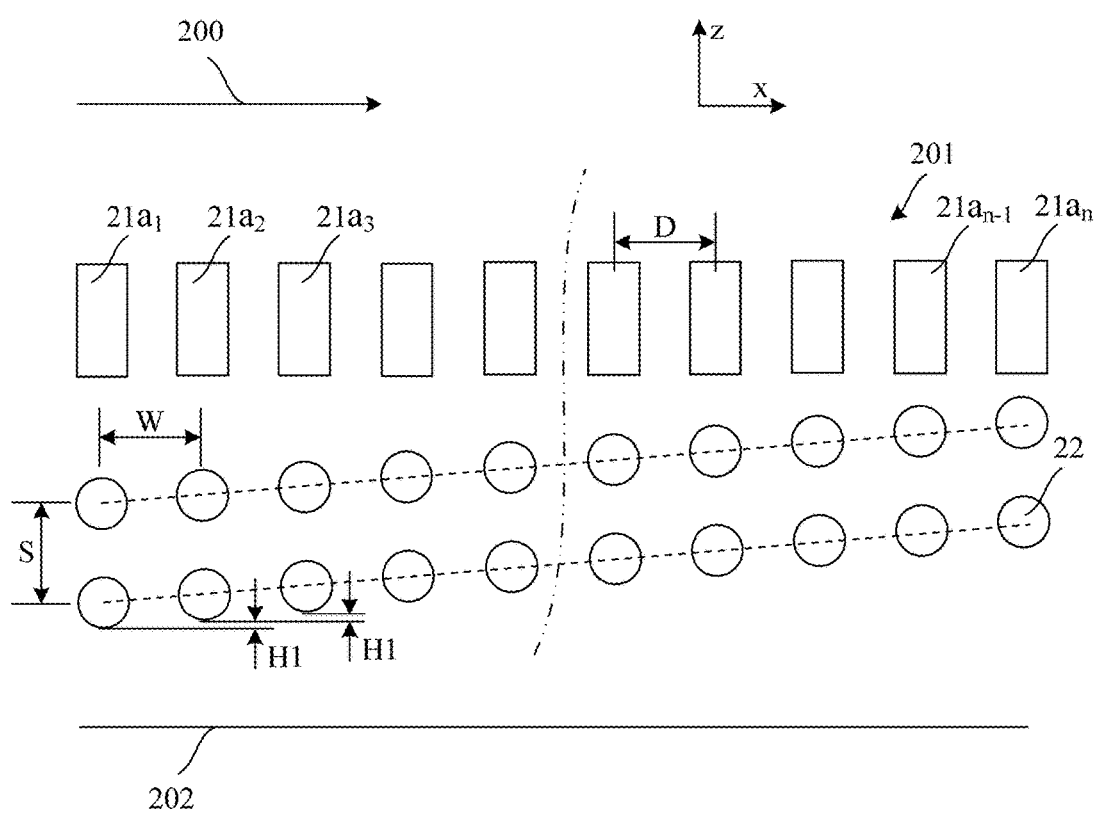

As shown in FIG. 4, an enlarged view of the droplet array 201 provided by the disclosed embodiments is illustrated. The droplet array 201 may include a plurality of nozzles arranged along the straight scanning direction 200. The plurality of nozzles, arranged along the straight scanning direction 200, may include a first nozzle $21a_1$, a second nozzle $21a_2$, a third nozzle $21a_3$, and an $N^{th}$ (N≥3) nozzle $21a_n$. The plurality of nozzles $21a_1$ to $21a_n$ arranged along the scanning direction may refer to the line connecting the center of each nozzle may be parallel to the scanning direction.

The distance D between two adjacent nozzles, among the droplet array 201 may be constant or unchanged. The plurality of nozzles may also sequentially eject droplets 22 to the radiating position according to a certain timing or pattern, so that the lateral or horizontal distance W between two adjacent droplets 22 may be constant (i.e., W=D). The plurality of droplets arriving at the radiating position may form an arc shape overall. Thus, when a laser beams scan along the straight scanning direction 200 and sequentially bombard the droplets 22 at the radiating position 202, plasma fragments generated by one bombarded droplet would not affect the next droplet (i.e., the droplet to be bombarded).

In one embodiment, the distance D between the centers of two adjacent nozzles may be about 45 μm to about 75 μm. The size of a droplet ejected by a nozzle may be about 25 to about 35 μm.

The plurality of nozzles, arranged along the straight scanning direction 200, may include a first nozzle $21a_1$, a second nozzle $21a_2$, a third nozzle $21a_3$, . . . , and an $N^{th}$ (N≥3) nozzle $21a_n$. The process that the plurality of nozzles 21 sequentially ejects droplets 22 downward to the radiating position 202 may include after the first nozzle $21a_1$ ejecting a first droplet, the second nozzle $21a_2$ ejecting a second droplet after lagging a first period behind the first nozzle $21a_1$, the third nozzle $21a_3$ ejecting a third droplet after lagging the first period behind the second nozzle $21a_2$, . . . , the $N^{th}$ nozzle $21a_n$ ejecting an $N^{th}$ droplet after lagging the first period behind the $(N-1)^{th}$ nozzle $21a_{n-}$. The first droplet, the adjacent second droplet, the third droplet, . . . , and the $N^{th}$ droplet may form a row of droplets.

Thus, after the first droplet ejected by the first nozzle $21a_1$ arrives at the radiating position 202, the second droplet ejected by the second nozzle $21a_2$ may arrive at the radiating position 202 behind the first droplet by the first period, the third droplet ejected by the third nozzle $21a_3$ may arrive at the radiating position 202 behind the second droplet by the first period, . . . , the $N^{th}$ droplet ejected by the $N^{th}$ nozzle $21an$ may arrive at the radiating position 202 behind the $(N-1)^{th}$ droplet by the first period.

The arrangement of the nozzles, including the first nozzle $21a_1$, the second nozzle $21a_2$, and the third nozzle $21a_3$, may be referred to FIGS. 3 and 4. When the plurality of nozzles are sequentially ejecting droplets downward to the radiating position 202, the laser source 203 may scan the generated first laser beam 31 or the second laser beam 32 along the straight scanning direction. The first laser beam 31 or the second laser beam 32 may sequentially bombard the droplets (i.e., the first droplet, the second droplet, the third droplet, . . . , and the $N^{th}$ droplet) in the row of droplets arriving at the radiating position 202. For example, for the first laser beam 31, the process to bombard the droplets may include bombarding the first droplet at the radiating position 202 with the first laser beam 31, generated by the laser source 203.

The process also includes, after bombarding the first droplet, the laser source 203 scanning the first laser beam 31 along the straight scanning direction 200 and bombarding the second droplet at the radiating position 202 when the second droplet arrives at the radiating position 202. The process also includes, the laser source 203 continuing to scan the first laser beam 31 along the straight scanning direction and bombarding the third droplet at the radiating position 202 when the third droplet arrives at the radiating position 202, so on and so forth. The process also includes, the laser source 203 continuing to scan the first laser beam 31 along the straight scanning direction and bombarding the $N^{th}$ droplet at the radiating position 202 when the $N^{th}$ droplet arrives at the radiating position 202.

When the first laser beam 31 sequentially bombards the first droplet, the second droplet, the third droplet, . . . , the $N^{th}$ droplet, the first droplet, the second droplet, the third droplet, . . . , and the $N^{th}$ droplet may be bombarded to form corresponding plasma. When the generated plasma radiates EUV light to the outside environment, the condenser 215 may rotationally scan simultaneously and sequentially collet the EUV light radiated when bombarding the first droplet, the second droplet, the third droplet, . . . , the $N^{th}$ droplet. The collected EUV light may be converged at the center of focus 220. The process to collect the EUV light generated from the bombardments may include after the condenser 215 collecting the EUV light generated from the bombardment and converging the collected EUV light at the first focal point, the condenser 215 continuing to rotationally scan and collect the EUV light generated from the bombardment of the second droplet.

The process also includes the condenser 215 converging the collected EUV light at the center of focus 220 and continuing to rotationally scan and collect the EUV light generated from the bombardment of the third droplet. The process also includes the condenser 215 converging the collected EUV light at the center of focus 220, so on and so forth. The process further includes the condenser 215 continuing to rotationally scan and collect the EUV light generated from the bombardment of the $N^{th}$ droplet and converging the collected EUV light at the center of focus 220.

Referring to FIG. 4, in one embodiment, the nozzles included in the droplet array, may include the first nozzle $21a_1$, the second nozzle $21hd\ 2$, the third nozzle $21a_3, \ldots$, and the $N^{th}$ (N≥3) nozzle $21a_n$. The nozzles may sequentially eject droplets 22 downward to the radiating position 202. The ejection process may include after the first nozzle $21a_1$ ejecting a first drop of the first droplet, the second nozzle $21a_2$ may lag behind the first nozzle $21a_1$ for a first period and eject a first drop of the second droplet; the third nozzle $21a_3$ may lag behind the second nozzle $21a_2$ for a first period and eject a first drop of the third droplet; . . . ; and the $N^{th}$ nozzle $21a_n$ may lag behind the $(N-1)^{th}$ nozzle $21a_{n-1}$ for a first period and eject a first drop of the $(N-1)^{th}$ droplet.

After the first nozzle $21a_1$ ejects the first drop of the first droplet, the first nozzle $21a_1$ may sequentially eject a second drop of the first droplet, the third drop of the first droplet, the fourth drop of the first droplet, . . . , and the $M^{th}$ (M≥4) drop of the first droplet. The first droplets may be ejected intermittently and two adjacent second drops of the first droplets may be separated by a second period. Similarly, after the second nozzle $21a_2$ ejects the first drop of the second droplet, the second nozzle $21a_2$ may sequentially eject a second drop of the second droplet, the third drop of the second droplet, the fourth drop of the second droplet, . . . , and the $M^{th}$ (M≥4) drop of the second droplet. The second droplet may be ejected intermittently and two adjacent the second droplets may be separated by the second period.

Similarly, after the third nozzle $21a_3$ ejects the first drop of the third droplet, the third nozzle $21a_3$ may sequentially eject a second drop of the third droplet, the third drop of the third droplet, the fourth drop of the third droplet, . . . , and the $M^{th}$ (M≥4) drop of the third droplet. The third droplets may be ejected intermittently and two adjacent third droplets may be separated by the second period, so on and so forth. Similarly, after the $N^{th}$ nozzle $21a_n$ ejects the first drop of the $N^{th}$ droplet, the $N^{th}$ nozzle $21a_n$ may sequentially eject a second drop of the $N^{th}$ droplet, the third drop of the $N^{th}$ droplet, the fourth drop of the $N^{th}$ droplet, . . . , and the $M^{th}$ (M≥4) drop of the $N^{th}$ droplet. The $N^{th}$ droplets may be ejected intermittently and two adjacent $N^{th}$ droplets may be separated by the second period.

The first drop of the first droplet, the first drop of the second droplet, the first drop of the third droplet, . . . , and the first drop of the $N^{th}$ droplet may form the first row of droplets; the second drop of the first droplet, the second drop of the second droplet, the second drop of the third droplet, . . . , and the second drop of the $N^{th}$ droplet may form the second row of droplets; and the third drop of the first droplet, the third drop of the second droplet, the third drop of the third droplet, . . . , and the third drop of the $N^{th}$ droplet may form the third row of droplets. Similarly, the $M^{th}$ drop of the first droplet, the $M^{th}$ drop of the second droplet, the $M^{th}$ drop of the third droplet, . . . , and the $M^{th}$ drop of the $N^{th}$ droplet may form the $M^{th}$ row of droplets. Two adjacent rows of droplets may be parallel to each other.

By using the disclosed method for ejecting droplets to form the droplet array 201, regular and continuing supply of droplets can be provided to the radiating position 202. The supply of droplets within a unit of time can be increased. Also, the first laser beam 31 and the second laser beam 32 generated by the laser source 203 (referring to FIG. 3) may be used to scan the droplets along the straight scanning direction 200 regularly to sequentially bombard the droplets 22 at the radiating position 202. The condenser 215 (referring to FIG. 3) may rotationally scan and collect the radiated EUV light regularly and simultaneously, and converge the collected EUV light at the center of focus 220 (referring to FIG. 3). The output power of the EUV light at the center of focus 220 can be improved.

Two adjacent droplets, in adjacent rows of droplets, ejected by a same nozzle may be timely separated by the second period. The second period may enable a distance S between two adjacent droplets ejected by a same nozzle. For example, the first drop of the first droplet and the second drop of the first droplet may be separated by a distance of S; the first drop of the second droplet and the second drop of the second droplet may be separated by the distance of S; the first drop of the third droplet and the second drop of the third droplet may be separated by the distance of S; . . . ; and the first drop of the $N^{th}$ droplet and the second drop of the $N^{th}$ droplet may be separated by the distance of S. The value of S may be about 45 μm to about 75 μm. S refers to a distance along a horizontal direction, i.e., X axis in FIG. 4.

Two adjacent droplets, in a same row of droplets, ejected by two adjacent nozzles may be timely separated by the first period. The first period may enable a distance H1 between two adjacent droplets ejected by the two adjacent nozzles. For example, the first drop of the first droplet and the first drop of the second droplet may be separated by a distance of H1, the first drop of the second droplet and the first drop of the third droplet may be separated by a distance of H1, the first drop of the third droplet and the first drop of the fourth droplet may be separated by a distance of H1, . . . , and the first drop of the $(N-1)^{th}$ droplet and the first drop of the $N^{th}$ droplet may be separated by a distance of H1. H1 refers to a distance along a vertical direction, i.e., Z axis in FIG. 4.

Referring to FIG. 3, the laser source 203 may include a laser 204, a reflector 209, and a second driving mechanism. The laser 204 may be configured to generate laser beams. The reflector 209 may be configured to reflect laser beams so that the reflected laser beams may transmit to the radiating position 202. The second driving mechanism may be connected with the reflector 209 to drive the reflector 209 to rotate, so that the reflected laser beams (the laser beams reflected by the reflector 209) may scan along the straight scanning direction 200. The reflected laser beams may sequentially bombard the droplets 22 at the radiating position 202.

The laser 204 may be a diode pump laser, with a sufficiently high frequency. The laser with the sufficiently high frequency may enable the laser beams to bombard a sufficient amount of droplets within a unit of time. The diode pump laser may be a Q-switching laser and/or a mode-locked laser.

The frequency of the pulses pumped by the laser 204 may be the same as the frequency of the ejection of droplets, the scanning frequency of the reflector, and the scanning frequency of the condenser mirror. When a droplet arrives at the radiating position, the corresponding laser beam may bombard the droplet, and the condenser mirror may collect the EUV light radiated by the bombardment of the droplet and converge the collected EUV light at the center of focus. In another embodiment, the laser 204 may be a $CO_2$ laser. The output power of the laser 204 may be about 10 KW to about 200 KW.

In one embodiment, the reflector 209 may include separated first reflector 207 and second reflector 208. The second driving mechanism may include a third sub-driving mechanism 205 and a fourth sub-driving mechanism 206. The first reflector 207 may be positioned atop the second reflector 208. The first reflector 207 may reflect a portion of the laser beams to form the first laser beam 31. The third sub-driving mechanism 205 may be connected to the first reflector 207. The third sub-driving mechanism 205 may drive the first reflector 207 to rotate so that the first laser beam 31 may scan along the straight scanning direction 200 and sequentially bombard the droplets at the radiating position 202. The second reflector 208 may reflect another portion of the laser beams to form the second laser beam 32. The fourth sub-driving mechanism 206 may be connected with the second reflector 208. The fourth sub-driving mechanism 206 may drive the second reflector 208 to rotate so that the second laser beam 32 may scan along the straight scanning direction 200 and sequentially bombard the droplets at the radiating position 202.

The third sub-driving mechanism 205 may be positioned atop of the first reflector 207. The third sub-driving mechanism 205 may be connected with the first reflector 207 through bearings. The fourth sub-driving mechanism 206 may be positioned below the second reflector 208. The fourth sub-driving mechanism 206 and the second reflector 208 may be connected through bearings. The bearings may be magnetic bearings and/or mechanical bearings.

The driving mode by which the third sub-driving mechanism 205 drives the first reflector 207 to rotate and the driving mode by which the fourth sub-driving mechanism 206 drives the second reflector 208 to rotate may be magnetic driving and/or piezoelectric driving.

The third sub-driving mechanism 205 and the fourth sub-driving mechanism 206 may include a power source and a driving circuit. The power source may provide power for the rotation of the first reflector 207 and the second reflector 208. The driving circuit may be used to provide driving signals for the power supply. The power source may be a motor.

A lens unit 219 may be positioned in the optical path between the laser 204 and the first reflector 207 and the optical path between the laser 204 and the second reflector 208. The lens unit 219 may be used to adjust the incident angles of the laser beams on the first reflector 207 and the second reflector 208, so that the first laser beam 31 reflected by the first reflector 207 and the second laser beam 32 reflected by the second reflector 208 may arrive at the radiating position 202.

In one embodiment, the reflector 209 may include separated first reflector 207 and second reflector 208. The second driving mechanism may include a third sub-driving mechanism 205 and a fourth sub-driving mechanism 206. The reasons for the arrangement mentioned above are described as follows.

In one embodiment, the reflector 209 may include separated first reflector 207 and second reflector 208. The second driving mechanism may include a third sub-driving mechanism 205 and a fourth sub-driving mechanism 206. The third sub-driving mechanism 205 may drive the first reflector 207 to rotate, and the fourth sub-driving mechanism 206 may drive the second reflector 208 to rotate. The first reflector 207 may reflect a portion of the laser beams to form the first laser beam 31. The second reflector 208 may reflect may reflect another portion of the laser beams to form the second laser beam 32.

The first laser beam 31 and the second laser beam 32 may alternately bombard droplets, arriving at the radiating position 202, of different rows of droplets. Because the output pulses must be continuous or sufficiently frequent to ensure a continuous supply of illumination power, the first laser beam 31 and the second laser beam 32 alternately scan different rows, e.g., adjacent rows of droplets. Because the scanning can cover all the droplets at the radiating position 202, the continuous supply of the output power of the EUV light can be provided.

In one embodiment, the process of the first laser beam 31 and the second laser beam 32 alternately bombarding different rows of droplets arrived at the radiating position 202 may include the following process. When the $L^{th}$ ($L \geq 1$) row of droplets arrives at the radiating position 202, the third sub-driving mechanism 205 may drive the first reflector 207 to rotate from an initial position so that the first laser beam 31 reflected by the first reflector 207 may scan along the straight scanning direction 200 and bombard the $L^{th}$ ($L \geq 1$) row of droplets arriving at the radiating position 202.

After the bombardment, the third sub-driving mechanism 205 may drive the first reflector 207 to move back to the initial position. Further, when the $(L+1)^{th}$ ($L \geq 1$) row of droplets arrives at the radiating position 202, the fourth sub-driving mechanism 206 may drive the second reflector 208 to rotate from the initial position so that the second laser beam 32 reflected by the second reflector 208 may scan along the straight scanning direction 200 and bombard the $(L+1)^{th}$ ($L \geq 1$) row of droplets arriving at the radiating position 202.

After the bombardment, the fourth sub-driving mechanism 206 may drive the second reflector 208 to move back to the initial position. Further, when the $(L+2)^{th}$ ($L \geq 1$) row of droplets arrives at the radiating position 202, the first laser beam 31 may scan along the straight scanning direction 200 and bombard the $(L+2)^{th}$ ($L \geq 1$) row of droplets arriving at the radiating position 202. After the bombardment, the third sub-driving mechanism 205 may drive the first reflector 207 to move back to the initial position.

Further, when the $(L+3)^{th}$ ($L \geq 1$) row of droplets arrives at the radiating position 202, the second laser beam 32 may scan along the straight scanning direction 200 and bombard the $(L+3)^{th}$ ($L \geq 1$) row of droplets arriving at the radiating position 202. After the bombardment, the fourth sub-driving mechanism 206 may drive the second reflector 208 to move back to the initial position. By repeating the process described above, continuous EUV light pulses may be generated and outputted.

In another embodiment, the process of the first laser beam 31 and the second laser beam 32 alternately bombarding droplets of different rows arrived at the radiating position 202 may include the following process. When the $L^{th}$ ($L \geq 1$) row of droplets arrives at the radiating position 202, the fourth sub-driving mechanism 206 may drive the second reflector 208 to rotate from an initial position so that the second laser beam 32 reflected by the second reflector 208 may scan along the straight scanning direction 200 and bombard the $L^{th}$ ($L \geq 1$) row of droplets arriving at the radiating position 202.

After the bombardment, the fourth sub-driving mechanism 206 may drive the second reflector 208 to move back to the initial position. Further, when the $(L+1)^{th}$ ($L \geq 1$) row of droplets arrives at the radiating position 202, the third sub-driving mechanism 205 may drive the first reflector 207 to rotate from the initial position so that the first laser beam 31 reflected by the first reflector 207 may scan along the straight scanning direction 200 and bombard the $(L+1)^{th}$ ($L \geq 1$) row of droplets arriving at the radiating position 202.

After the bombardment, the third sub-driving mechanism 205 may drive the first reflector 207 to move back to the initial position. Further, when the $(L+2)^{th}$ ($L \geq 1$) row of droplets arrives at the radiating position 202, the second laser beam 32 may scan along the straight scanning direction 200 and bombard the $(L+2)^{th}$ ($L \geq 1$) row of droplets arriving at the radiating position 202. After the bombardment, the fourth sub-driving mechanism 206 may drive the second reflector 208 to move back to the initial position.

Further, when the $(L+3)^{th}$ ($L \geq 1$) row of droplets arrives at the radiating position 202, the first laser beam 31 may scan along the straight scanning direction 200 and bombard the $(L+3)^{th}$ ($L \geq 1$) row of droplets arriving at the radiating position 202. After the bombardment, the third sub-driving mechanism 205 may drive the first reflector 207 to move back to the initial position. By repeating the process described above, continuous EUV light pulses may be generated and outputted.

In one embodiment, the first laser beam 31 may be used to bombard the first row of droplets, the second laser beam 32 may be used to bombard the second row of droplets, the first laser beam 31 may be used to bombard the third row of droplets, and the second laser beam 32 may be used to bombard the fourth row of droplets. The embodiment is now exemplified in detail using the arrangement described above.

In the process, when the first drop of the first droplet in the first row arrives at the radiating position 202, the first reflector 207 may be at the initial position. A portion of the laser beams generated by the laser 203 may be reflected by the first reflector 207 to form the first laser beam 31. The first laser beam 31 may transmit to the radiating position 202 and bombard the first drop of the first droplet in the first row of droplets. Further, other droplets in the first row of droplets may arrive at the radiating position 202, each lagging a first period behind the previous droplet. Accordingly, the third sub-driving mechanism 205 may drive the first reflector 207 to rotate, and the first laser beam 31 may be reflected by the first reflector 207 and may scan along the straight scanning direction 200 to sequentially bombard other droplets in the first row of droplets arriving at the radiating position 202. When the first laser beam 31 finishes bombarding the last droplet in the first row of droplets, the first reflector 207 may rotate to an ending position. Further, the third sub-driving mechanism 205 may drive the first reflector 207 to rotate back to the initial position.

When the second drop of the first droplet in the second row of droplets arrives at the radiating position 202, the second reflector 208 may be at the initial position. A portion of the laser beams generated by the laser 203 may be reflected by the second reflector 208 to form the second laser beam 32. The second laser beam 32 may transmit to the radiating position 202 and bombard the second drop of the first droplet in the second row of droplets. Further, other droplets in the second row of droplets may arrive at the radiating position 202, each lagging a first period behind the previous droplet.

Accordingly, the fourth sub-driving mechanism 206 may drive the second reflector 208 to rotate, and the second laser beam 32 may be reflected by the second reflector 208 and may scan along the straight scanning direction 200 to sequentially bombard other droplets in the second row of droplets arriving at the radiating position 202. When the second laser beam 32 finishes bombarding the last droplet in the second row of droplets, the second reflector 208 may rotate to an ending position. Further, the fourth sub-driving mechanism 206 may drive the second reflector 208 to rotate back to the initial position.

Further, when the third row of droplets sequentially arrives at the radiating position 202, the first laser beam 31 may scan along the straight scanning position 200 and sequentially bombard the third row of droplets arriving at the radiating position 202. After the first beam finishes bombarding the last droplet of the third row of droplets, the first reflector 207 may rotate back to the initial position. Further, when the fourth row of droplets sequentially arrives at the radiating position 202, the second laser beam 32 may scan along the straight scanning position 200 and sequentially bombard the fourth row of droplets arriving at the radiating position 202. After the second beam 32 finishes bombarding the last droplet of the fourth row of droplets, the second reflector 208 may rotate back to the initial position.

To prevent the first laser beam 31 and the second laser beam 32 from affecting each other and/or affecting formation of the EUV light during the bombardment of the droplets, a first aperture 210 may be formed between the first reflector 31 and the radiating position 202 and a second aperture 211 may be formed between the second reflector 32 and the radiating position 202. The first aperture 210 may be used to prevent the first laser beam 31 from transmitting to the radiating position 202. The second aperture 211 may be used to prevent the second laser beam 32 from transmitting to the radiating position 202.

The first aperture 210 may include a first blocking unit and a third driving mechanism connected with the first blocking unit. The second aperture 211 may include a second blocking unit and a fourth driving mechanism connected with the second blocking unit. The third driving mechanism may be configured to drive the first blocking unit to be in the transmission path through which the first laser beam 31 transmits to the radiating position, i.e., the transmission path of the first laser beam 31. The third driving mechanism may also be configured to drive the first blocking unit to move away from the transmission path of the first laser beam 31. The fourth driving mechanism may be connected to the second blocking unit. The fourth driving mechanism may be configured to drive the second blocking unit to be in the transmission path through which the second laser beam 32 transmits to the radiating position, i.e., the transmission path of the second laser beam 32. The fourth driving mechanism may also be configured to drive the second blocking unit to move away from the transmission path of the second laser beam 32.

Thus, when the first laser beam 31 is bombarding the droplets at the radiating position 202, the fourth driving mechanism may drive the second blocking unit to be in the transmission path of the second laser beam 32 to prevent the second laser beam 32 from transmitting to the radiating position 202. When the second laser beam 32 starts to bombard the droplets at the radiating position, the fourth driving mechanism may drive the second blocking unit to move away from the transmission path of the second laser beam 32, so that the second laser beam 32 may transmit to the radiating position 202.

Similarly, when the second laser beam 32 is bombarding the droplets at the radiating position 202, the third driving mechanism may drive the first blocking unit to be in the transmission path of the first laser beam 31 to prevent the first laser beam 31 from transmitting to the radiating position 202. When the first laser beam 31 starts to bombard the droplets at the radiating position, the third driving mechanism may drive the first blocking unit to move away from the transmission path of the first laser beam 31, so that the first laser beam 31 may transmit to the radiating position 202.

Figure 5:
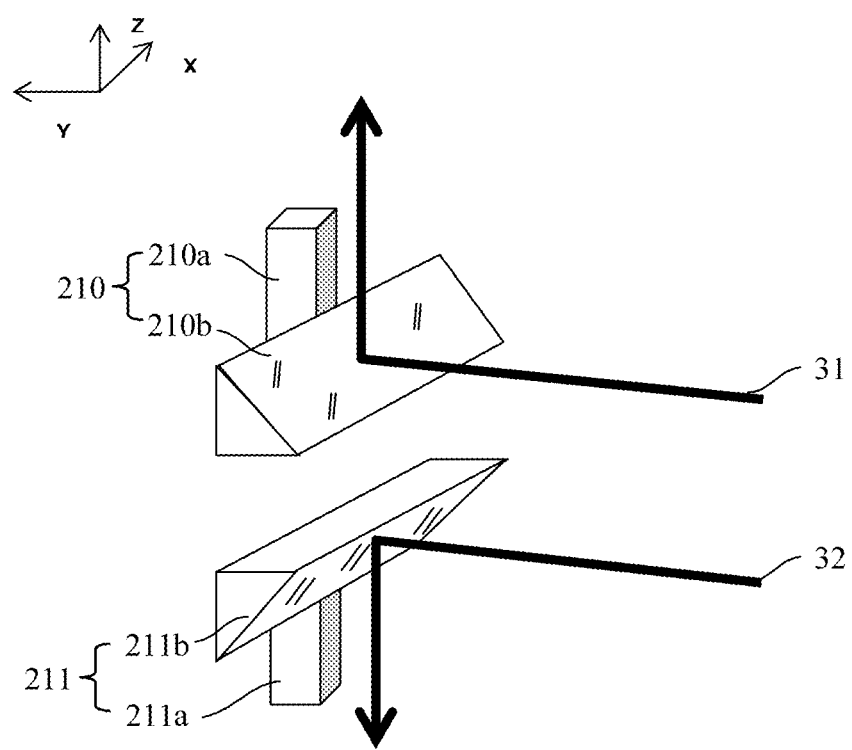

As show in FIG. 5, the structures of the first aperture 210 and the second aperture 211 described in the disclosed embodiments are illustrated. The first aperture 210 may include the first blocking unit 210b and the third driving mechanism 210a connected with the first blocking unit 210b. The second aperture 211 may include the second blocking unit 211b and the fourth driving mechanism 211a connected with the second blocking unit 211b. In one embodiment, the first blocking unit 210b may be a third reflector. When the third reflector is blocking the first laser beam 31, the third reflector may reflect the first laser 31 away from the second aperture 211 (or along the positive direction of Z axis). The second blocking unit 211b may be a fourth reflector. When the fourth reflector is blocking the second laser beam 32, the fourth reflector may reflect the first laser 32 away from the first aperture 210 (or along the negative direction of Z axis).

In other embodiments of the present disclosure, the first blocking unit may reflect the first laser beam 31 towards the positive direction or negative direction of X axis. The second blocking unit may reflect the second laser beam 32 towards the positive direction or negative direction of X axis.

In the reflection transmission path of the first laser beam 31 (the transmission path of the first laser beam 31 after reflected by the third reflector) and the reflection transmission path of the second laser beam 32 (the transmission path of the second laser beam 32 after reflected by the fourth reflector), heat recycle units (not shown) may be positioned. The heat recycle units may be used to absorb the first laser beam 31 reflected by the third reflector and the second laser beam 32 reflected by the fourth reflector. The absorption of the reflected first laser beam 31 and reflected second laser beam 32 may prevent the reflected first laser beam 31 and the reflected second laser beam 32 from being reflected again.

Referring to FIG. 3, the condenser 215 may be positioned between the reflector 209 and the radiating position 202. The condenser 215 may include the condenser mirror and the first driving mechanism. The condenser mirror may include a reflective ellipsoidal surface, facing the radiating position 202. The reflective ellipsoidal surface may collect radiated EUV light and reflect to converge the collected EUV light at the center of focus 220. The first driving mechanism may be connected to the condenser mirror, configured to drive the condenser mirror to rotationally scan. When the first laser beam 31 or the second laser beam 32 sequentially bombard the droplets arriving at the radiating position 202 to form radiated EUV light, the condenser mirror may collect and reflect the radiated EUV light to converge the collected EUV light at the center of focus 220.

A path 218 may be included in the center of the condenser mirror so that the laser beam reflected by the condenser mirror may transmit through the path 218 to the radiating position 202 and bombard the droplet at the radiating position. In one embodiment, the path 218 may be a through hole.

The condenser mirror may include separated upper portion condenser mirror 212 and lower portion condenser mirror 213. The upper portion condenser mirror 212 may be positioned atop the lower portion condenser mirror 213. The upper portion condenser mirror 212 may include at least two separated first sub-condenser mirrors 212a. The lower portion condenser mirror 213 may include at least two separated second sub-condenser mirrors 213a. The first driving mechanism may include at least two first sub-driving mechanism 216a and at least two second sub-driving mechanism 217a. Each first sub-driving mechanism 216a may be connected with a first sub-condenser mirror 212a. Each second sub-driving mechanism 217a may be connected with a second sub-condenser mirror 213a. The at least two first sub-driving mechanism 216a may drive the at least two first sub-condenser mirrors 212a to rotationally scan simultaneously, and the at least two second sub-driving mechanism 217a may drive the at least two second sub-condenser mirrors 21aa to rotationally scan simultaneously.

The condenser mirror may be divided by the plane, containing the center of focus 220 and the radiating position 202, into the upper portion condenser mirror 212 and the lower portion condenser mirror 213, symmetric to each other. The upper portion condenser mirror 212 may include at least two separated first sub-condenser mirrors 212a. The lower portion condenser mirror 213 may include at least two separated second sub-condenser mirrors 213a.

In one embodiment, the upper portion condenser mirror 212 and the lower portion condenser mirror 213 may be formed by a splitting and/or cutting process performed on an integral ellipsoidal condenser mirror. Further, the formed upper portion condenser mirror 212 may be divided into the at least two first sub-condenser mirrors 212a through a splitting and/or cutting process; and the formed lower portion condenser mirror 213 may be divided into the at least two second sub-condenser mirrors 213a through a splitting and/or cutting process.

In one embodiment, the upper portion condenser mirror 212 may include two separated first sub-condenser mirrors 212a; and the lower portion condenser mirror 213 may include two separated second sub-condenser mirrors 213a.

In one embodiment, a first splitting surface may be positioned between the upper portion condenser mirror 212 and the lower portion condenser mirror 213. The first splitting surface may be the surface splitting or dividing the upper portion condenser mirror 212 and the lower portion condenser mirror 213, or the surface containing the center of focus 220 and the radiating position 202. The upper portion condenser mirror 212 and the lower portion condenser mirror 213 may be symmetric about the first splitting surface.

Two adjacent first sub-condenser mirrors 212a may be separated by a second splitting surface. A second splitting surface may be a surface splitting or dividing the adjacent first sub-condenser mirrors 212a. A second splitting surface may be perpendicular to the first splitting surface. Two adjacent second sub-condenser mirrors 213a may be separated by a third splitting surface. A third splitting surface may be a surface splitting or dividing the adjacent second sub-condenser mirrors 213a. A third splitting surface may be perpendicular to the first splitting surface.

The upper portion condenser mirror 212 may be divided into at least two first sub-condenser mirrors 212a by a plurality of the second splitting surfaces. The lower portion condenser mirror 213 may be divided into at least two second sub-condenser mirrors 212a by a plurality of the third splitting surfaces. The at least two first sub-condenser mirrors 212a may be divided from the center of the condenser mirror according to a same angle, and the at least two second sub-condenser mirrors 213a may be divided from the center of the condenser mirror according to a same angle. The at least two first sub-condenser mirrors 212a may each have a same area, and the at least two second sub-condenser mirrors 213a may each have a same area. The at least two first sub-condenser mirrors 212a may each have a same weight, and the at least two second sub-condenser mirrors 213a may each have a same weight.

The number of the first sub-condenser mirrors 212a may be equal to the number of the second sub-condenser mirrors 213a. The number of the first sub-driving mechanism 216a may be equal to the number of the second sub-driving mechanism 217a. Each first sub-condenser mirror 212a may be connected with a corresponding first sub-driving mechanism 216a. Each second sub-condenser mirror 213a may be connected with a corresponding second sub-driving mechanism 217a.

The first sub-driving mechanism 216a and the second sub-driving mechanism 217a may include a driving circuit, a power source, shafts, and bearings. The power source may be connected to a terminal of each shaft through the bearings. The other terminal of each shaft may be connected with the back of a first sub-condenser mirror 212a or the back of a second sub-condenser mirror 213a through fixed connections. The power source may provide power to the upper portion condenser mirror 212 and the lower portion condenser mirror 213. The driving circuit may provide driving signals to the power source. The power source may be an actuator. The bearings may be magnetic bearings and/or mechanical bearings.

In one embodiment, the condenser mirror may have an ellipsoidal shape. The condenser mirror may include the upper portion condenser mirror 212 and the lower portion condenser mirror 213. The upper portion condenser mirror 212 and the lower portion condenser mirror 213 may both have half of the ellipsoidal shape. The upper portion condenser mirror 212 may include a plurality of separated first sub-condenser mirrors 212a. The plurality of separated first condenser mirrors 212a may be arranged to form the half ellipsoidal shape. Each one of the first sub-condenser mirrors 212a may be connected with a corresponding first sub-driving mechanism 216a. The plurality of first sub-driving mechanism 216a may drive the first sub-condenser mirrors 212 to rotationally scan simultaneously.

During the scanning process, the relative position between two adjacent first sub-condenser mirrors 212a may be kept unchanged. The lower portion condenser mirror 213 may include a plurality of separated second sub-condenser mirrors 212a. The plurality of separated second condenser mirrors 213a may be arranged to form the half ellipsoidal shape. Each one of the second sub-condenser mirrors 213a may be connected with a corresponding second sub-driving mechanism 217a. The plurality of second sub-driving mechanism 217a may drive the second sub-condenser mirrors 213a to rotationally scan simultaneously. During the scanning process, the relative position between two adjacent second sub-condenser mirrors 213a may be kept unchanged.

In one embodiment, a portion of the laser generated by the laser 203 may be reflected by the first reflector 207 to form the first laser beam 31, and another portion of the laser generated by the laser 203 may be reflected by the second reflector 208 to form the second laser beam 32. The first laser beam 31 and the second laser beam 32 may scan different rows of droplets along the straight scanning direction 200. The first sub-driving mechanism 216a may be used to drive the upper portion condenser mirror 212 to rotationally scan and collect the EUV light formed from the first laser beam 31 bombarding a row of droplets.

The second sub-driving mechanism 217a may be used to drive the lower portion condenser mirror 213 to rotationally scan and collect the EUV light formed from the second laser beam 32 bombarding another row of droplets. Specifically, when the first laser beam 31 bombards a row of droplets arriving at the radiating position 202 along the straight scanning direction 200, the upper portion condenser mirror 212 may be driven by the first sub-driving mechanism 216a to rotationally scan. The upper portion condenser mirror may collect the EUV light radiated by the bombarded droplets and converge the collected EUV light at the center of focus 220. When the second laser beam 32 bombards a next row of droplets arriving at the radiating position 202 along the straight scanning direction 200, the lower portion condenser mirror 213 may be driven by the second sub-driving mechanism 217a to rotationally scan. The lower portion condenser mirror may collect the EUV light radiated by the bombarded droplets and converge the collected EUV light at the center of focus 220.

The rotational scanning of the upper portion condenser mirror 212 and the rotational scanning of the first reflector 207 may be simultaneous or performed at same steps. The rotational scanning of the lower portion condenser mirror 213 and the rotational scanning of the second reflector 208 may be simultaneous or performed at same steps.

Figure 15:
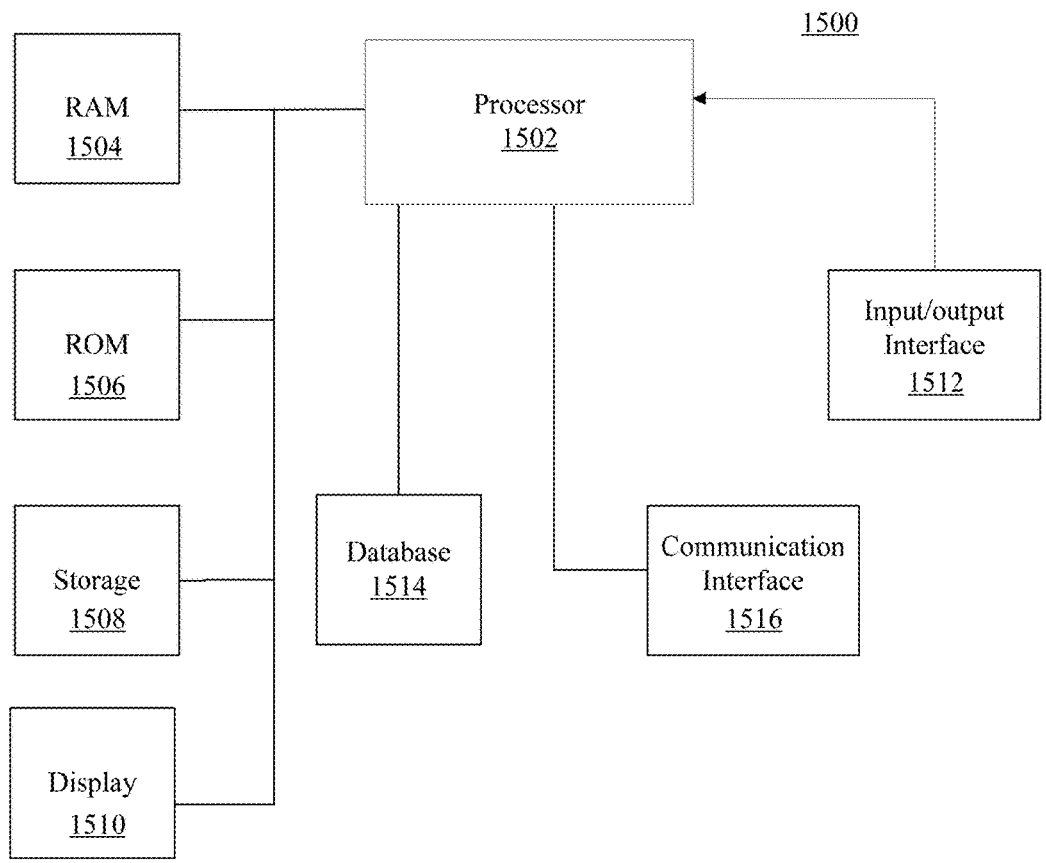
FIG. 15 illustrates an exemplary control unit consistent with the disclosed embodiments of the present disclosure.

The EUV light source may further include a control unit, shown in FIG. 15. The control unit may output synchronized first signals, second signals, and third signals. The first signals may be used to control the plurality of nozzles to eject droplets sequentially. The second signals may be used to control the second driving mechanism to drive the reflectors to rotate synchronously. The third signals may be used to control the first driving mechanism to drive the condenser mirrors to rotate synchronously.

FIG. 15 illustrates a block diagram of an exemplary control unit 1500 to accept, process, and execute commands from the operator or outside environment. The control unit 1500 may include any appropriately configured computer system. As shown in FIG. 15, the control unit 1500 may include a processor 1502, a random access memory (RAM) unit 1504, a read-only memory (ROM) unit 1506, a storage unit 1508, a display 1510, an input/output interface unit 1512, a database 1514; and a communication interface 1516. Other components may be added and certain devices may be removed without departing from the principles of the disclosed embodiments.

Processor 1502 may include any appropriate type of general purpose microprocessor, digital signal processor or microcontroller, and application specific integrated circuit (ASIC). Processor 1502 may execute sequences of computer program instructions to perform various processes associated with system 1500. Computer program instructions may be loaded into RAM 1504 for execution by processor 1502 from read-only memory 1506, or from storage 1508. Storage 1508 may include any appropriate type of mass storage provided to store any type of information that processor 1502 may need to perform the processes. For example, storage 1508 may include one or more hard disk devices, optical disk devices, flash disks, or other storage devices to provide storage space.

Display 1510 may provide information to a user or users, e.g., an operator and/or a processing engineer, of system 1500. Display 1510 may include any appropriate type of computer display device or electronic device display (e.g., CRT or LCD based devices). Input/output interface 1512 may be provided for users to input information into the control unit 1500 or for the users to receive information from the control unit 1500. For example, input/output interface 1512 may include any appropriate input device, such as a keyboard, a mouse, an electronic tablet, voice communication devices, or any other optical or wireless input devices. Further, input/output interface 1512 may receive from and/or send to other external devices.

Further, database 1514 may include any type of commercial or customized database, and may also include analysis tools for analyzing the information in the databases. Database 1514 may be used for storing information for semiconductor manufacturing and other related information. Communication interface 1516 may provide communication connections such that the control unit 1500 may be accessed remotely and/or communicate with other systems through computer networks or other communication networks via various communication protocols, such as transmission control protocol/internet protocol (TCP/IP), hyper text transfer protocol (HTTP), etc.

In one embodiment, an operator or a process engineer may input commands on the input/output interface 1512 to perform various functions. The processor 1502 may accept, process, and execute the commands to obtain data from the operation on the EUV light source. The communication interface can communicate with EUV light source to collect and process data obtained from the operation, such as intensity of the collected EUV light and positions of the reflectors. Suitable data may be stored in ROM 1506 and storage 1508 to be processed. After the data is processed, result of the operation can be obtained. The result can be returned to the operator/process engineer via the display 1510 or the input/output interface 1512.

The EUV light source may further include a cleaning system, configured to clean the contamination on the reflective surface of the condenser mirror. For example, the contamination may be splashed fragments generated in the bombardment of the droplets.

Figure 6:
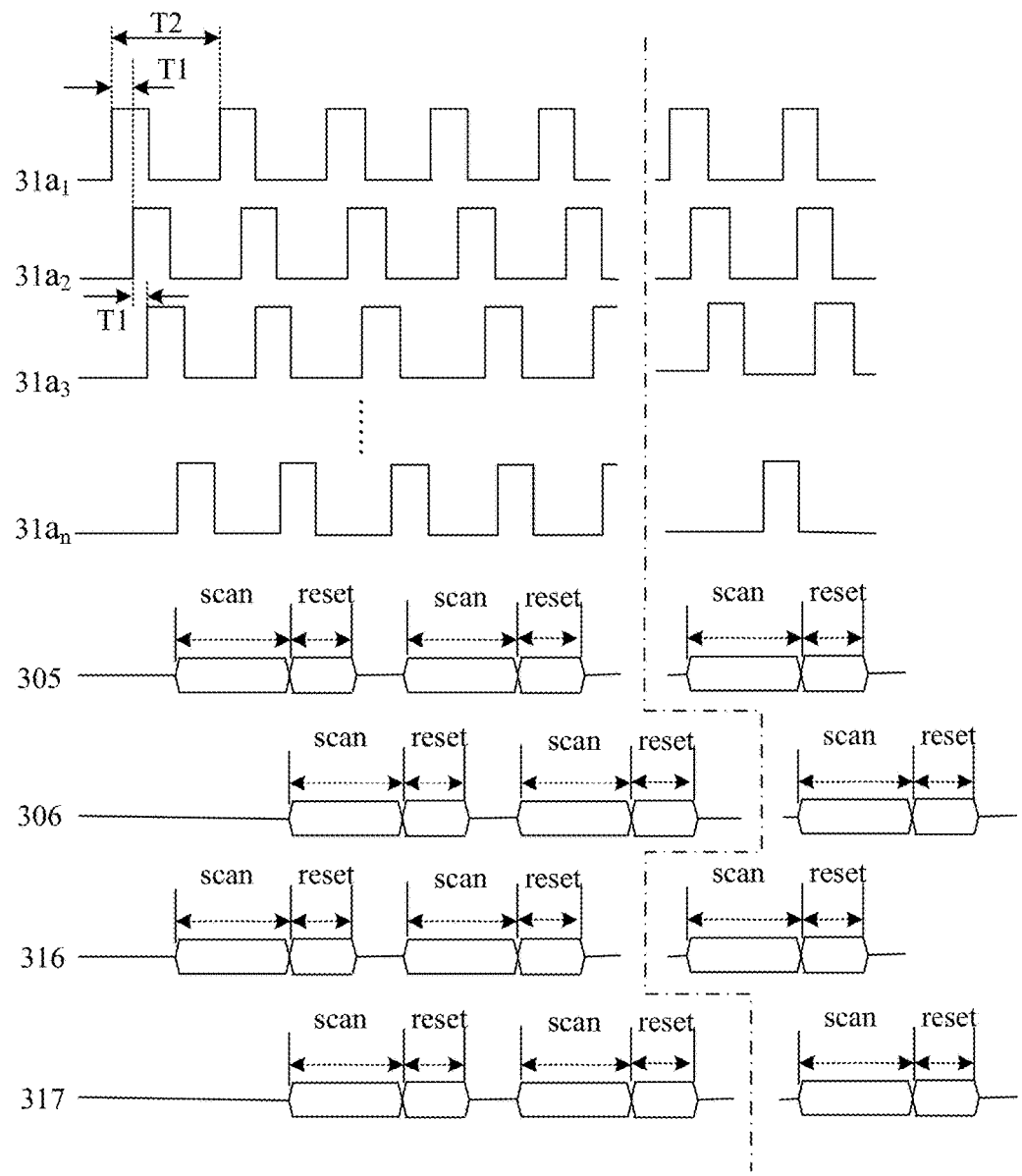
FIG. 6 illustrates the control signal diagram of an exemplary EUV light source consistent with the disclosed embodiments of the present disclosure.

FIG. 6 illustrates a control signal diagram in the disclosed embodiments. The first signals may include $31a_1$, $31a_2$, $31a_3$, ..., and $31a_n$. The second signals may include 305 and 306. The third signals may include 316 and 317.

The first signals, the second signals, and the third signals may be generated based on one clock signal. The number of the first signals may be equal to the number of the nozzles. The first signal $31a_1$, the first signal $31a_2$, the first signal $31a_3$, ..., and the first signal $31a_n$ may be used to control the first nozzle $31a_1$, the second nozzle $21a_2$, the third nozzle $21a_3$, ..., and the $N^{th}$ nozzle $21a_n$, as shown in FIG. 4, may be used to control the on and off states of the corresponding switches on the nozzles. The second signal 305 may be used to control the third sub-driving mechanism 205 and drive the first reflector 207 to rotate, as shown in FIG. 3. The second signal 306 may be used to control the fourth sub-driving mechanism 206 and drive the second reflector 208 to rotate, as shown in FIG. 3. The third signal 316 may be used to control the first sub-driving mechanism 216a to drive the upper portion condenser mirror 212 to rotate. The third signal 317 may be used to control the second sub-driving mechanism 217a to drive the lower portion condenser mirror 213 to rotate, as shown in FIG. 2.

Figure 7:
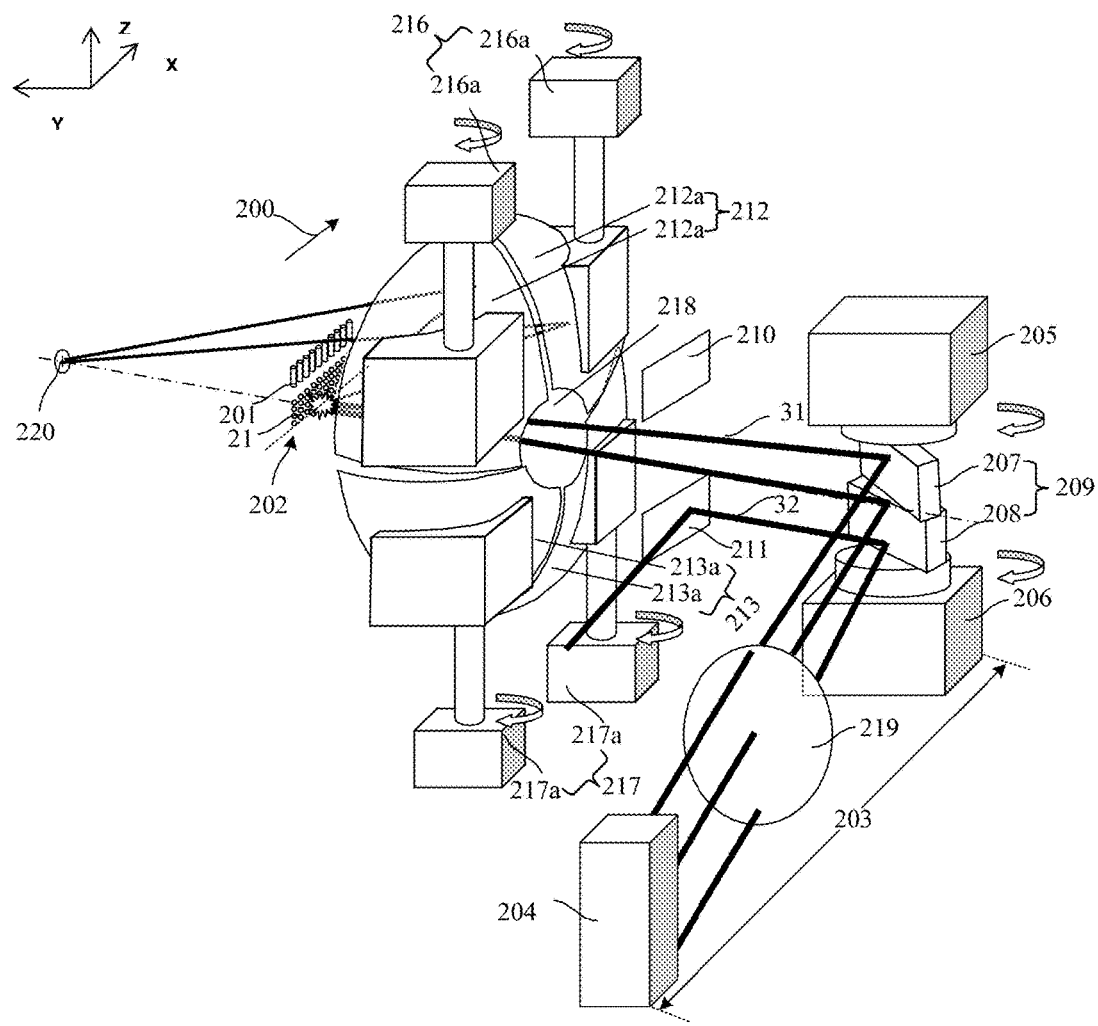
FIGS. 7 and 8 illustrate the structure of another exemplary EUV light source consistent with the disclosed embodiments of the present disclosure.
Figure 8:
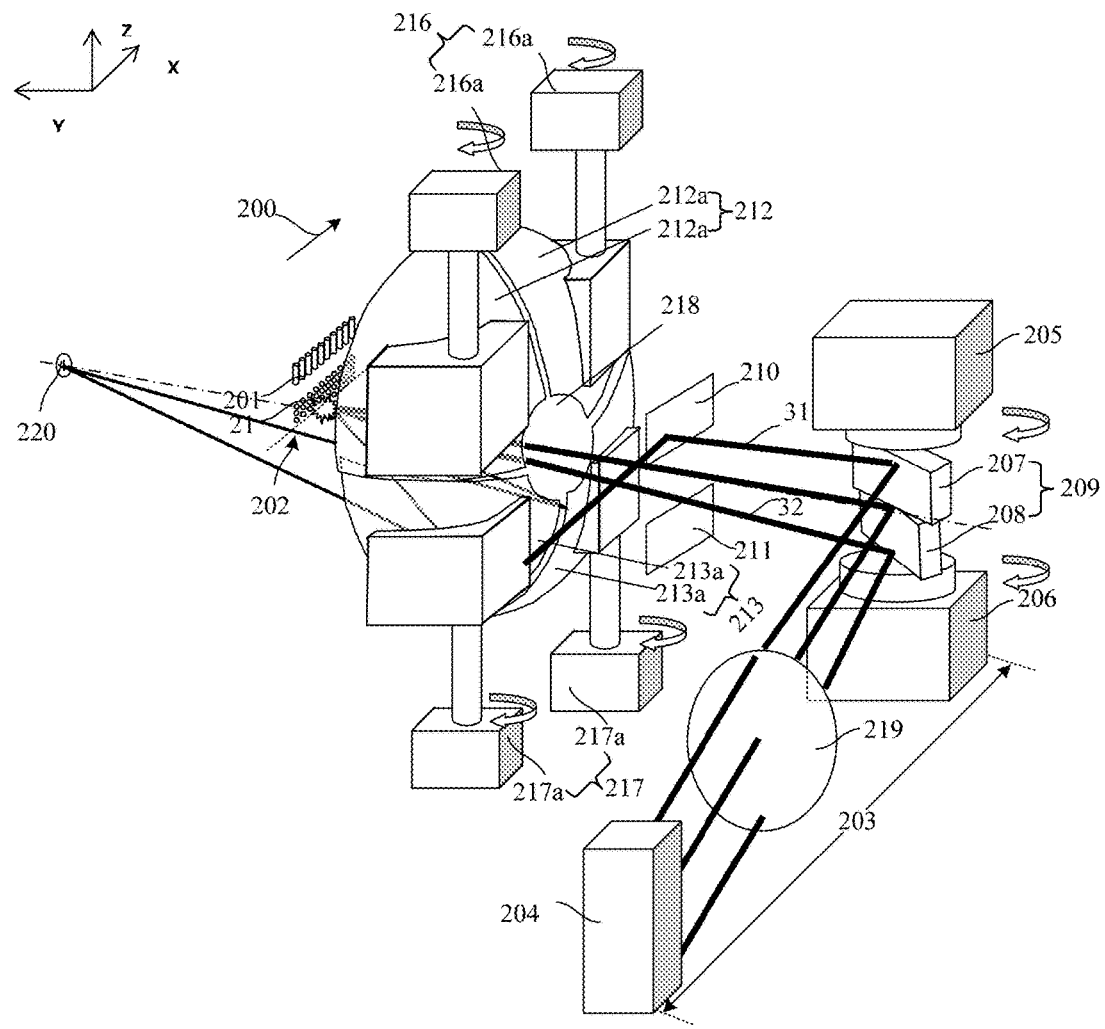

FIGS. 6 to 8 are described in detail to illustrate an exemplary operation process of the EUV light source disclosed by the embodiments of the present disclosure. It should be noted that the arrangement of droplets in FIG. 7 and FIG. 8 are only for illustrative purposes and should not be limited by the embodiments of the present disclosure.

As shown in FIGS. 6 and 7, the first signal $31a_1$, the first signal $31a_2$, the first signal $31a_3$, ..., and the first signal $31a_n$ may be pulse signals. Two adjacent pulses, ejected by the same nozzle, may be separated by the second period T2. The first signal $31a_2$ may lag the first signal $31a_1$ for the first period T1; the first signal $31a_3$ may lag the first signal $31a_2$ for the first period T1, so on and so forth. The first signal $31a_n$ may lag the first signal $31a_{n-1}$ (the previous first signal) for the first period T1. Two adjacent pulses of a first signal may be separated by the second period T2.

The first signals may satisfy the relationship of N×T1=T2, where N may be the number of the first signals or the number of the nozzles, T1 may be the first period, and T2 may be the second period. Thus, the first laser beam 31 and the second laser beam 32 may alternately bombard different rows of droplets at the radiating position.

That is, when the first signal $31a_1$, the first signal $31a_2$, the first signal $31a_3$, ..., and the first signal $31a_n$ are applied on the corresponding switches of the plurality of nozzles 21 (referring to the first nozzle $31a_1$, the second nozzle $21a_2$, the third nozzle $21a_3$, ..., and the $N^{th}$ nozzle $21a_n$ in FIG. 3, N≥3), the nozzles may eject a plurality of droplets sequentially downward to the radiating position 202. For example, the plurality of droplets may include the first row of droplets, the second row of droplets, the third row of droplets, ..., and the $M^{th}$ (M≥3) row of droplets.

Each row of droplets may include the first drop of the first droplet ejected by the first nozzle $21a_1$, the first drop of the second droplet ejected by the second nozzle $21a_2$, the first drop of the third droplet ejected by the third nozzle $21a_3$, ..., and the first drop of the $N^{th}$ droplet ejected by the $N^{th}$ nozzle $21a_n$. The ejection time of the second nozzle $21a_2$ may lag behind the ejection time of the first nozzle $21a_1$ for T1; the ejection time the third nozzle $21a_3$ may lag behind the ejection time the second nozzle $21a_2$ for T1; ... ; the ejection time the $N^{th}$ nozzle $21a_n$ may lag behind the ejection time of the $(N-1)^{th}$ nozzle $21a_{n-1}$ for T1. In addition, the ejection of two adjacent rows of droplets may be separated by T2.

Before the nozzles eject droplets, the first reflector 207 and the second reflector 208 may both be at the first initial position, and the upper portion condenser mirror 212 and the lower portion condenser mirror 213 may be at the third initial position. When the first droplet, ejected by the first nozzle $21a_1$, arrives at the radiating position 202, the first reflector 207 or the second reflector 208 may be driven by the third sub-driving mechanism 205 or the fourth sub-driving mechanism 206 to move from the first initial position to the second initial position through accelerated motion. When the first reflector 207 or the second reflector 208 is at the second initial position, the first laser beam 31 reflected by the first reflector 207 or the second laser beam reflected by the second reflector 208 may bombard the first droplet, ejected by the first nozzle $21a_1$, arriving at the radiating position 202.

Meanwhile, the upper portion condenser mirror 212 or the lower portion condenser mirror 213 may be driven by a plurality of first sub-driving mechanism 216a or a plurality of second sub-driving mechanism 217a to move from the third initial position to the fourth initial position through accelerated motion. When the upper portion condenser mirror 212 or the lower portion condenser mirror 213 is at the fourth initial position, the upper portion condenser mirror 212 or the lower portion condenser mirror 213 may collect the EUV light generated from the bombardment of the first droplet and converge the collected EUV light at the center of focus 220.

In one embodiment, as examples, the first laser beam 31 may bombard the first row of droplets arriving at the radiating position 202 first, and the second laser beam 32 may further bombard the second row of droplets arriving at the radiating position 202. The corresponding second signals and third signals may be referred to FIG. 6.

In some other embodiments of the present disclosure, the second laser beam 32 may bombard the first row of droplets arriving at the radiating position 202 first, and the first laser beam 31 may further bombard the second row of droplets arriving at the radiating position 202.

In one embodiment, the second signal 305 may include a plurality of alternating scanning stages and resetting stages, labeled as "scan" and "reset" in FIG. 6, respectively. The starting time of the first scanning stage of the second signal 305 may lag the first pulse of the first signal $31a_1$ for a third period. The third period may be equal to the duration between the time the first nozzle $21a_1$ starting to eject the first drop of the first droplet and the time the first drop of the first droplet arriving at the radiating position 202. The ending time of the first scanning stage of the second signal 305 may lag the first pulse of the first signal $31a_n$ for a fourth period. The fourth period may be equal to the duration between the time the $N^{th}$ nozzle $21a_n$ starting to eject the first drop of the $N^{th}$ droplet and the time the first drop of the $N^{th}$ droplet arriving at the radiating position 202.

After the first scanning stage, the first resetting stage may start directly. No time interval may exist between a scanning stage and an adjacent resetting stage. The scanning stage of the second signal 305 may be equal to T2. The total time of a scanning stage and an adjacent resetting stage may be less than twice of T2. The duration between the ending of one scanning stage and the beginning the next scanning stage may be T2. The scanning stage of the second signal 305 may be used to control the third sub-driving mechanism 205 to drive the first reflector 207 to rotate at a uniform speed from the second initial position. The resetting stage of the second signal 306 may be used to control the third sub-driving mechanism 205 to drive the third reflector 207 to rotate back to the first initial position. Before each scanning stage of the second signal 305 starts, an acceleration stage may be included. The acceleration stages of the second signal 305 may be used to control the third sub-driving mechanism 205 to drive the third reflector 207 to move from the first initial position to the second initial position through accelerated motion.

Accordingly, in one embodiment, the third signal 316 may include a plurality of alternating scanning stages and resetting stages, labeled as "scan" and "reset" in FIG. 6, respectively. The third signal 316 may be synchronized with the second signal 305. That is, the starting time and the ending time of a scanning stage in the third signal 316 may be the same as the starting times and the ending time of the corresponding scanning stage in the second signal 305; and the starting time and the ending time of a resetting stage of the third signal 316 may be the same as the starting times and the ending time of the corresponding resetting stage of the second signal 305.

The scanning stages of the third signal 316 may be sued to control the plurality of first sub-driving mechanism 216a to drive the upper portion condenser mirror 212 to rotationally scan from the fourth initial position with a uniform speed. The resetting stages of the third signal 316 may be used to control the first sub-driving mechanism 216a to drive the upper condenser mirror 212 to rotate back to the third initial position. Before each scanning stage of the third signal 316 starts, an acceleration stage may be included. The acceleration stages of the third signal 316 may be used to control the first sub-driving mechanism 216a to drive the upper portion condenser mirror 212 to move from the third initial position to the fourth initial position through accelerated motion.

The second signal 306 may include a plurality of alternating scanning stages and resetting stages, labeled as "scan" and "reset" in FIG. 6, respectively. The starting time of the first scanning stage of the second signal 306 may lag the second pulse of the first signal $31a_1$ for a fifth period. The fifth period may be equal to the duration between the time the first nozzle $21a_1$ starting to eject the second drop of the first droplet and the time the second drop of the first droplet arriving at the radiating position 202. The fifth period may be equal to the third period. The ending time of the first scanning stage of the second signal 305 may lag the second pulse of the first signal $31an$ for a sixth period. The sixth period may be equal to the duration between the time the $N^{th}$ nozzle $21a_n$ starting to eject the second drop of the $N^{th}$ droplet and the time the second drop of the $N^{th}$ droplet arriving at the radiating position 202. The sixth period may be equal to the fourth period.

After the first scanning stage, the first resetting stage may start directly. No time interval may exist between a scanning stage and an adjacent resetting stage. The scanning stage of the second signal 306 may be equal to T2. The total time of a scanning stage and an adjacent resetting stage may be less than twice of T2. The duration between the ending of one scanning stage and the beginning the next scanning stage may be T2. The starting time of the first scanning stage of the second signal 306 may follow tightly behind the ending time of the first scanning stage of the second signal 305, so that after the first laser beam 31 bombards a row of droplets arriving at the radiating position 202, the second laser beam 32 may start bombarding the next row of droplets arriving at the radiating position 202 immediately.

Accordingly, in one embodiment, the third signal 317 may include a plurality of alternating scanning stages and resetting stages, labeled as "scan" and "reset" in FIG. 6, respectively. The third signal 317 may be synchronized with the second signal 306. That is, the starting time and the ending time of a scanning stage of the third signal 317 may be the same as the starting times and the ending time of the corresponding scanning stage of the second signal 306; and the starting time and the ending time of a resetting stage of the third signal 317 may be the same as the starting times and the ending time of the corresponding resetting stage of the second signal 306.

The scanning stages of the third signal 317 may be used to control the plurality of second sub-driving mechanism 217a to drive the lower portion condenser mirror 213 to rotationally scan from the fourth initial position with a uniform speed. The resetting stages of the third signal 317 may be used to control the second sub-driving mechanism 217a to drive the lower condenser mirror 213 to rotate back to the third initial position. Before each scanning stage of the third signal 317 starts, an acceleration stage may be included. The acceleration stages of the third signal 317 may be used to control the second sub-driving mechanism 217a to drive the lower portion condenser mirror 213 to move from the third initial position to the fourth initial position through accelerated motion.

The total time of a scanning stage and an adjacent resetting stage in the second signal 305, the second signal 306, the third signal 316, and the third signal 317 may be less than twice the T2.

In a specific operation, the nozzles in the droplet array 201 may receive the first signals; the third sub-driving mechanism 205 may receive the second signal 305; the fourth sub-driving mechanism 206 may receive the second signal 306; a plurality of the first sub-driving mechanism 216a may receive the third signal 316; and a plurality of the second sub-driving mechanism 217a may receive the third signal 317. The nozzles may start to eject droplets downward to the radiating position 202. The droplets may include the first row of droplets, the second row of droplets, the third row of droplets, the fourth row of droplets, . . . , the $M^{th}$ (M≥4) row of droplets. When the first droplet of the first row of droplets arrives at the radiating position 202, the third sub-driving mechanism 205 may drive the first reflector 207 to move from the first initial position to the second initial position through accelerated motions. The first laser beam 31 may bombard the first droplet at the radiating position.

Meanwhile, a plurality of first sub-driving mechanism 216a may drive the upper portion condenser mirror 212 to move from the third initial position to the fourth initial position through accelerated motions. The upper portion condenser mirror 212 may collect the EUV light radiated by the bombardment of the first droplet of the first row of droplets, and converge the collected EUV light at the center of focus 220 through reflection. Further, the first scanning stage in the second signal 305 may be used to control the third sub-driving mechanism 205 to drive the first reflector 207 to rotate at a uniform speed from the second initial position. The first laser beam 31 may bombard other droplets of the first row of droplets, arriving sequentially at the radiating position 202, along a scanning direction. Meanwhile, the first scanning stage of the third signal 316 may be used to control the plurality of first sub-driving mechanism 216a to drive the upper portion condenser mirror 212 to rotate at a uniform speed from the second initial position. The upper portion condenser mirror 212 may collect the EUV light radiated by the bombardment of other droplets of the first row of droplets, and converge the collected EUV light at the center of focus 220.

In one embodiment, the scanning direction may be a direction parallel to X axis. The first reflector 207 and the upper portion condenser mirror 212 may rotate along a clockwise direction (top view).

The rotation speed of the first reflector 207 may be uniform. The angular velocity of the first reflector 207 may be equal to the rotation angle of the first reflector 207, the angle the first reflector 207 rotates between the bombardments of two adjacent droplets of the first row of droplets by the first laser beam 31, divided by T1.

The rotation speed of the upper portion condenser mirror 212 may be uniform. The angular velocity of the upper portion condenser mirror 212 may be equal to the rotation of the upper portion condenser mirror 212, the angle the upper portion condenser mirror 212 rotates between the collection of EUV light generated by the bombardment of two adjacent droplets of the first row of droplets by the upper portion condenser mirror 212, divided by T1.

When the first laser beam 31 bombards the first droplet of the first row of droplets, the second aperture 211 may block the transmission of the second laser beam 32 to the radiating position 202.

Further, referring to FIGS. 6 and 8, after the first laser beam 31 bombards the first row of droplets, the first reflector 207 may arrive at an ending position. The first resetting stage of the second signal 305 may be used to control the third sub-driving mechanism 205 to drive the first reflector 207 to rotate back to the first initial position and get ready for bombarding the third row of droplets arriving at the radiating position. Meanwhile, the first resetting stage of the third signal 316 may control the first sub-driving mechanism 216a to drive the upper portion condenser mirror 212 to rotate back to the third initial position and get ready for collecting the EUV light generated from the bombardment of the third row of droplets.

When the upper portion condenser mirror 212 is rotating back, the upper portion condenser mirror 212 may still be able to converge light. The scanning of the upper portion condenser mirror 212 when the upper portion condenser mirror 212 is rotating back should be scheduled to be staggered with the scanning of the lower portion condenser mirror 213. That is, when the scanning angle of the upper portion condenser mirror 212 and the scanning angle of the lower portion condenser mirror 213 become the same, the upper portion condenser mirror 212 and the lower portion condenser mirror 213 should both target at the space between droplets. In other words, the upper portion condenser mirror 212 and the lower portion condenser mirror 213 should not target at the same droplet to cause the intensity of EUV light at the center of focus 220 to become overly high. The staggered arrangement may be obtained through the adjustment of a small lead and/or a small lag in time when the upper portion condenser mirror 212 is rotating back.

After the last droplet of the first row of droplets is bombarded, the first droplet of the second row of droplets may arrive at the radiating position 202. The fourth sub-driving mechanism 206 may drive the second reflector 208 to move from the first initial position to the second initial position through accelerated motion. The second laser beam 32 may bombard the first droplet of the second row of droplets at the radiating position. Meanwhile, the plurality of second sub-driving mechanism 217a may drive the lower portion condenser mirror 213 to be at an initial position to collect the EUV light generated by the bombardment of the first droplet of the second row of droplets.

Further, the first scanning stage of the second signal 306 may be used to control the fourth sub-driving mechanism 206 to drive the second reflector 208 to rotate at a uniform speed from the second initial position. The second laser beam 32 may bombard other droplets of the second row of droplets arriving sequentially at the radiating position 202 along a scanning direction. Meanwhile, the first scanning stage of the third signal 317 may be used to control the second sub-driving mechanism 217a to drive the lower portion condenser mirror 213 to rotate at a uniform speed from the third initial position. The lower portion condenser mirror 213 may sequentially collect the EUV light generated from the bombardment of the other droplets of the second row of droplets. The lower portion condenser mirror 213 may converge the collected EUV light at the center of focus 220.

After the second laser beam 32 bombards the second row of droplets, the second reflector 208 may arrive at an ending position. The first resetting stage of the second signal 306 may be used to control the fourth sub-driving mechanism 206 to drive the second reflector 208 to rotate back to the first initial position and get ready for bombarding the fourth row of droplets arriving at the radiating position. Meanwhile, the first resetting stage of the third signal 317 may control the second sub-driving mechanism 217a to drive the lower portion condenser mirror 213 to rotate back to the third initial position and get ready for collecting the EUV light generated from the bombardment of the fourth row of droplets.

When the lower portion condenser mirror 213 is rotating back, the lower portion condenser mirror 213 may still be able to converge light. The scanning of the lower portion condenser mirror 213 when the lower portion condenser mirror 213 is rotating back should be scheduled to be staggered with the scanning of the upper portion condenser mirror 212. That is, when the scanning angle of the upper portion condenser mirror 212 and the scanning angle of the lower portion condenser mirror 213 become the same, the upper portion condenser mirror 212 and the lower portion condenser mirror 213 should both target at the space between droplets. In other words, the upper portion condenser mirror 212 and the lower portion condenser mirror 213 should not target at the same droplet to cause the intensity of EUV light at the center of focus 220 to become overly high. The staggered arrangement may be obtained through the adjustment of a small lead and/or a small lag in time when the lower portion condenser mirror 213 is rotating back.

By repeating the process described above, the output power of the EUV light at the center of focus 220 may be improved. The EUV light converged at the center of focus 220 may be the output EUV light outputted by the EUV light source.

Detection units such as position sensor and/or counters may be used to detect if the first reflector 207, the second reflector 208, the upper portion condenser mirror 212, and the lower portion condenser mirror 213 have arrived at the corresponding initial positions and/or the corresponding ending positions. The detected signals may be sent to the corresponding driving mechanism of the parts described above as feedback signals to adjust the driving processes of the first reflector 207, the second reflector 208, the upper portion condenser mirror 212, and the lower portion condenser mirror 213.

Further, the present disclosure also provides an exposure apparatus. The exposure apparatus may include the previously described EUV light source. The EUV light source may be used as the exposure light source of the exposure apparatus in operation. The specific structure of the exposure apparatus may be referred to an existing exposure apparatus and is not repeated herein.

Figure 9:
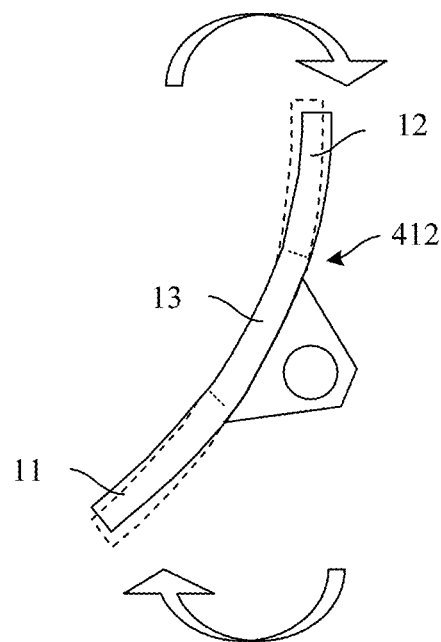
FIGS. 9 and 10 illustrate the exemplary states of the condenser mirror during rotation consistent with the disclosed embodiments of the present disclosure.
Figure 10:
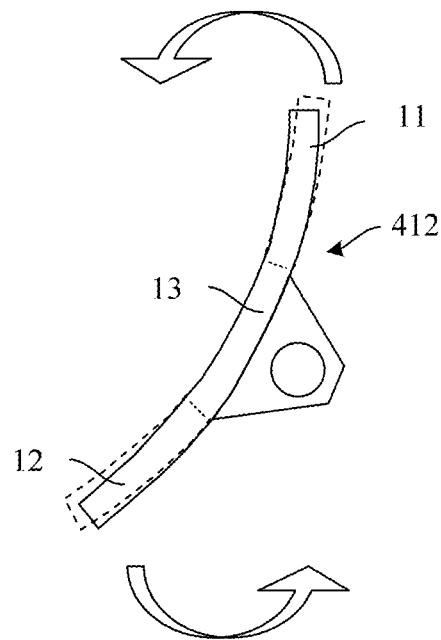

FIGS. 9 and 10 are cross-section views of the condenser mirror with the reflective ellipsoidal surface when the condenser mirror is rotationally scanning. The cross-section views are ideal illustrations of the condenser mirror along a plane parallel to the XY plane. It should be noted that the condenser mirror may represent the upper portion condenser mirror or the lower portion condenser mirror in FIG. 2, or the first sub-condenser mirror or the second sub-condenser mirror in FIG. 3.

As shown in FIG. 9, along the clockwise direction for rotational scanning, the condenser mirror 412 may include a first side region 11, a central region 13, and a second side region 12. The first side region 11 may be positioned on one side of the central region 13 and the second side region 12 may be positioned on the other side of the central region 13. The solid lines in FIG. 9 may represent the ideal positions of the first side region 11 and the second side region 12, where an ideal position may refer to a position at which the condenser mirror 214 is able to converge the collected EUV light at one center of focus. The dashed lines may represent the actual positions of the first side region 11 and the second side region 12 after elastic deformation.

After elastic deformation, the position of the focal point of the reflected EUV light may deviate from the center of focus. When the condenser mirror 412 rotationally scans along the clockwise direction, the first side region 11 may undergo elastic deformation along the outward direction with respect to the ellipsoidal surface, and the second side region 12 may undergo elastic deformation along the inward direction with respect to the ellipsoidal surface.

As shown in FIG. 10, along the counter-clockwise direction for rotational scanning, the condenser mirror 412 may include a first side region 11, a central region 13, and a second side region 12. The first side region 11 may be positioned on one side of the central region 13 and the second side region may be positioned on the other side of the central region 13. The solid lines in FIG. 9 may represent the ideal positions of the first side region 11 and the second side region 12, where an ideal position may refer to a position at which the condenser mirror 214 is able to converge the collected EUV light at one center of focus.

The dashed lines may represent the actual positions of the first side region 11 and the second side region 12 after elastic deformation. After elastic deformation, the position of the focal point of the reflected EUV light may deviate from the center of focus. When the condenser mirror 412 rotationally scans along the counter-clockwise direction, the first side region 11 may undergo elastic deformation along the inward direction with respect to the ellipsoidal surface, and the second side region 12 may undergo elastic deformation along the outward direction with respect to the ellipsoidal surface.

Thus, embodiments of the present disclosure provide calibration for the offsets of the condenser mirror of the EUV light source to compensate the elastic deformation of the condenser mirror during the rotational scanning. Embodiments of the present disclosure provide a calibration apparatus for correcting the aberrations for the condenser mirror of the EUV light source.

Figure 11:
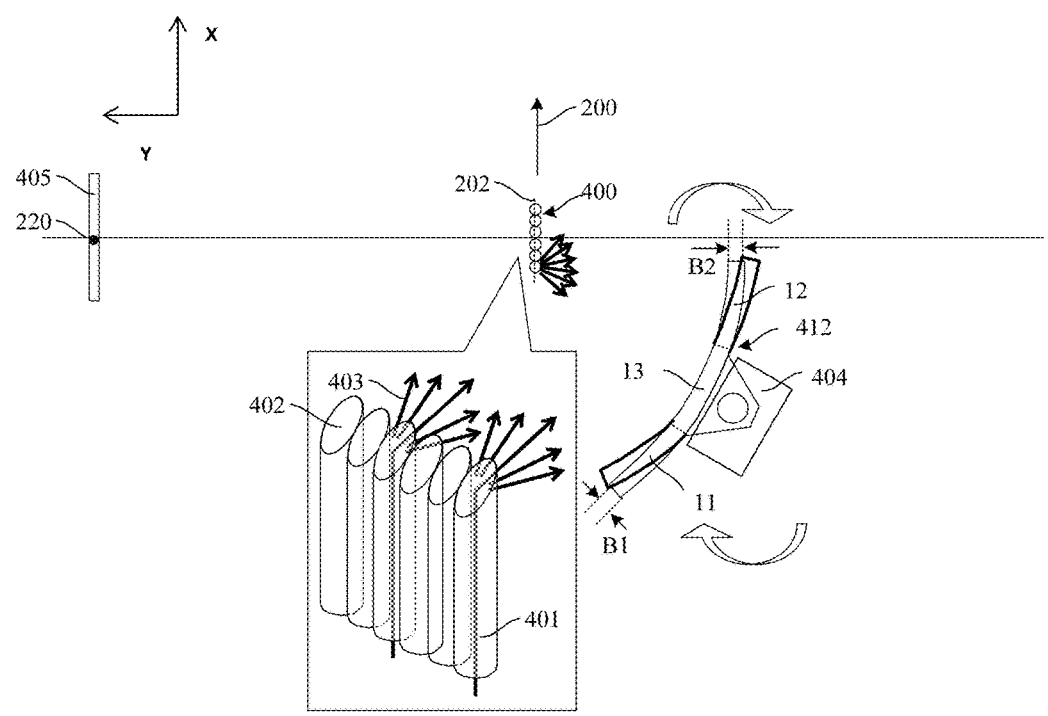
FIG. 11 illustrates the structure of an exemplary offset value calibration apparatus for the condenser mirror in an exemplary EUV light source consistent with the disclosed embodiments of the present disclosure.

As shown in FIG. 11, the offset calibration apparatus for the condenser mirror of the EUV light source may include an illuminant 400, a condenser stage 404, and an array detector 405.

The illuminant 400 may be positioned at the radiating position 202. The illuminant 400 may include a plurality of light sources 401 arranged along a straight scanning direction 200, e.g., the EUV light sources. The plurality of light sources 401 may emit light 403 sequentially.

The condenser stage 404 may be configured to carry the to-be-calibrated or to-be-corrected condenser mirror 412 and drive the to-be-corrected condenser mirror 412 to rotationally scan, so that the reflective ellipsoidal surface of the to-be-corrected condenser mirror 412 may collect light emitted by the light sources 401 and converge the collected light at the center of focus 200 through reflection.

The array detector 405 may be positioned at the center of focus 220. The array detector 405 may include a standard center point. The standard center point of the array detector 405 may overlap with the center of focus 220. The array detector 405 may be configured to detect the light reflected by the to-be-corrected condenser mirror 412 to obtain a detection spot. The array detector 405 may compare the position difference between the detection spot and the standard center point.

Specifically, the light sources 401 may be optical fibers. The top of each optical fiber may include an inclined surface 402. An inclined surface 402 may have a 45° inclination angle with respect to the Y direction or X direction, e.g., the horizontal direction. The light transmitted in the optical fibers may be reflected by the inclination surfaces 402 to transmit to the reflective ellipsoidal surface of the to-be-corrected condenser mirror 412.

The optical fiber may include a core and a cladding surrounding the core. The diameter of the core may be about 2 µm to about 10 µm. Thus, a single optical fiber may be used as a point light source to emit light so that the light emitted by the optical fibers may be used to imitate the EUV light generated from the bombardments of the droplets. The number of the optical fibers may be equal to the number of the nozzles. The distance between two adjacent optical fibers may be equal to the distance between two adjacent nozzles. Thus, the optical fibers may be suitable imitations for the bombardments of ejected droplets at the radiating position in the EUV light source.

The plurality of light sources 401 may include a first light source, a second light source, . . . , an $N^{th}$ (N≥3) light source arranged along the straight scanning direction 200. The number of the light sources may be equal to the number of the nozzles. In one embodiment, the straight scanning direction 200 may be the positive direction of X axis. In certain other embodiments of the present disclosure, the straight scanning direction 200 may also be other suitable directions such as the negative direction of X axis.

The plurality of light sources 401 may be illuminated or turned on sequentially along the straight scanning direction 200 to imitate the state when the droplets arriving at the radiating position are bombarded sequentially. The lighting time of one light source 401 and the lighting time of an adjacent light source 401 may be separated by a first period. That is, the time to light one light source 401 may lag the first period behind the time to light a previous adjacent light source 401.

The light transmitted in the optical fibers may be emitted by light-emitting diode (LED) light sources. The light emitted by the LED light sources may be coupled to the optical fibers from one terminal of each optical fiber. The coupled light may be transmitted in the optical fibers. Each optical fiber may correspond to one LED light source. The first signals $31a_1$ to $31a_n$, shown in FIG. 6, may be used to control the on and off states of the LED light sources.

The array detector 405 may be a charged coupled device (CCD) and/or a complementary metal oxide semiconductor (CMOS) image sensor. The CCD or the CMOS image sensor may include a plurality of pixel units arranged in rows. The diameter of each pixel unit in the array may be less than the diameter of the detection spot so that the array detection 405 may have sufficiently high detection accuracy. In one embodiment, the diameter of a pixel unit may be about 1 μm to about 10 μm, and the diameter (D in FIG. 13) of a detection spot may be about 70 μm to about 100 μm. The CCD and/or the CMOS image sensor may be connected to a processor, a computer, or any suitable device capable of processing the detected signals and/or images. In one embodiment, the CCD and/or the CMOS image sensor may be connected to the control unit. The control unit may receive the images and/or signals collected by the CCD and/or the CMOS image sensor and compare the position difference between the detection spot and the standard center point. The control unit may also capable to proceed to further actions based on the result of the comparison.

The radiating position 202 may correspond to the first focal point of the reflective ellipsoidal surface of the to-be-corrected condenser mirror 412. The center of focus 220 may correspond to the second focal point of the reflective ellipsoidal surface of the to-be-corrected condenser mirror 412.

Figure 12:
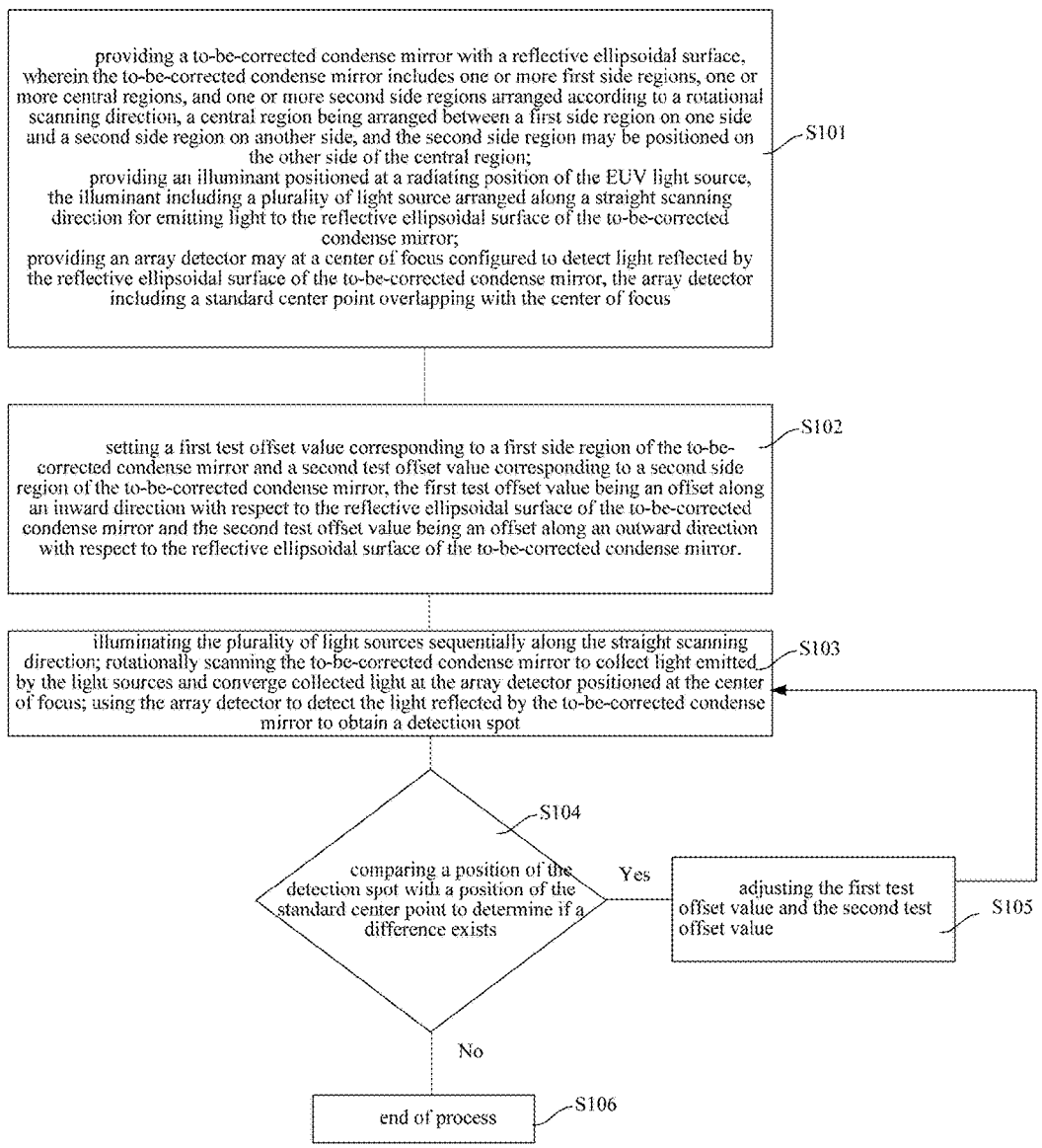
FIG. 12 illustrates an exemplary process flow of the calibrating method for the condenser mirror consistent with the disclosed embodiments of the present disclosure.

Further, the present disclosure also provides a method for correcting the offsets or correcting the aberration of the condenser mirror in an EUV light source. As shown in FIG. 12, the method includes steps S101 to S106.

In step S101, a to-be-corrected condenser mirror may be provided. The to-be-corrected condenser mirror may include a reflective ellipsoidal surface. The to-be-corrected condenser mirror may include a first side region, a central region, and a second side region arranged according to a clockwise direction. The first side region may be positioned on one side of the central region and the second side region may be positioned on the other side of the central region.

An illuminant may be positioned at the radiating position. The illuminant may include a plurality of light sources (e.g., the optical fibers) arranged along a straight scanning direction. The light sources may be configured to emit light to the reflective ellipsoidal surface of the to-be-corrected condenser mirror. An array detector may be positioned at a center of focus. The array detector may include a standard center point. The standard center point of the array detector may overlap with the center of focus. The array detector may be configured to detect the light reflected by the reflective ellipsoidal surface of the to-be-corrected condenser mirror.

In step S102, a first test offset value corresponding to the first side region of the to-be-corrected condenser mirror and a second test offset value corresponding to the second side region of the to-be-corrected condenser mirror can be set. The first test offset value may be an offset along an inward direction with respect to the ellipsoidal surface of the to-be-corrected condenser mirror. The second test offset value may be an offset along an outward direction with respect to the ellipsoidal surface of the to-be-corrected condenser mirror.

In step S103, the plurality of light sources may emit light sequentially along the straight scanning direction, and the to-be-corrected condenser mirror may rotationally scan to collect the light emitted by the light sources. By reflection, the to-be-corrected condenser mirror may converge the collected light at the array detector positioned at center of focus. The array detector may detect the light reflected by the to-be-corrected condenser mirror to obtain a detection spot.

In step S104, the position of the detection spot may be compared to the position of the standard center point to determine if a difference exists. If the position of the detection spot is the same as the position of the standard center point, step S106, end of the process, can be executed and the operation can be ended. If the position of the detection spot is different from the position of the standard center point, step S105, adjusting the first test offset value and the second test offset value, can be executed. Also, the first test offset value and the second test offset value can be adjusted and steps S103 and S104 may be executed repeatedly until the position of the detection spot is the same as the position of the standard center point.

Figure 13:
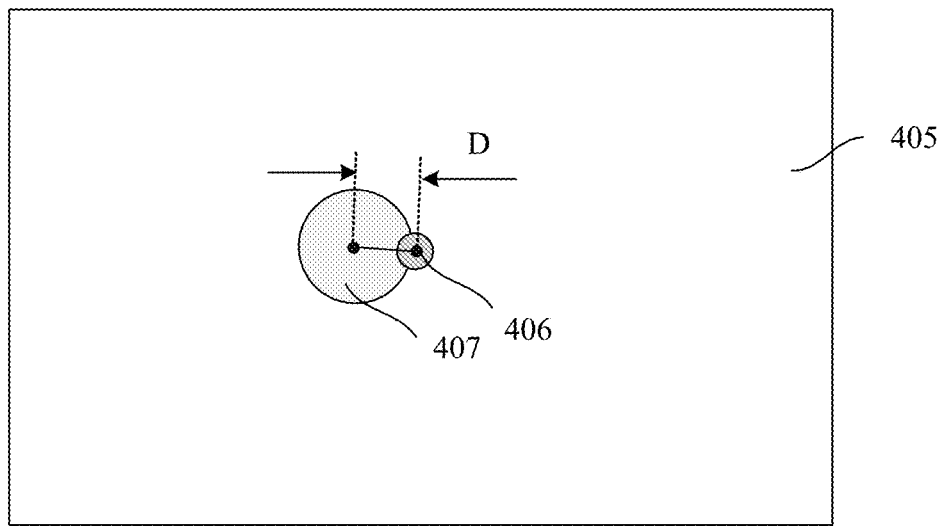
FIG. 13 illustrates the structure of an exemplary array detector consistent with the disclosed embodiments of the present disclosure.

The calibration or correction process can be described in detail using FIGS. 11 and 13.

At the beginning of the process, a to-be-corrected condenser mirror 412 may be provided. The to-be-corrected condenser mirror 412 may include a reflective ellipsoidal surface. The to-be-corrected condenser mirror 412 may include a first side region 11, a central region 13, and a second side region 12 arranged along a rotational scanning direction. The first side region 11 may be positioned on one side of the central region 13, and the second side region 12 may be positioned on the other side of the central region 13.

An illuminant 400 may be positioned at the radiating position 202. The illuminant may include a plurality of light sources 401 arranged along a straight scanning direction 200. The light sources 401 may emit light to the reflective ellipsoidal surface of the to-be-corrected condenser mirror 412.

The array detector 405 may be positioned at the center of focus 220. The array detector 405 may include a standard center point. The standard center point of the array detector 405 may overlap with the center of focus.

Further, a first test offset value corresponding to the first side region of the to-be-corrected condenser mirror 412 and a second test offset value corresponding to the second side region of the to-be-corrected condenser mirror 412 can be set. The first test offset value may be an offset along an inward direction with respect to the ellipsoidal surface of the to-be-corrected condenser mirror. The second test offset value may be an offset along an outward direction with respect to the ellipsoidal surface of the to-be-corrected condenser mirror.

The first test offset value and the second test offset value may both be empirical values. The first test offset value and the second test offset value may also be equal to or close to the elastic deformation of the condenser mirror.

In one embodiment, the ranges of the first test offset value and the second test offset value may be about 5 μm to about 1000 μm. After subsequent detection and determination, the first test offset value and/or the second test offset value may be increased accordingly to obtain a best calibration or correction value. The adjustment of the first test offset value and the second test offset value may be subjected to the position difference between the detection spot and the standard center point, and/or according to required deformation of the to-be-corrected condenser mirror.

In another embodiment, when correcting the condenser mirror, the first side region 11 and the second side region 12 may each be divided into a plurality of calibration sub-regions. The first test offset value and the second test offset value of each calibration sub-region may be same or different.

In other embodiments of the present disclosure, the first test offset value and the second test offset value may also be of other suitable values.

Further, the to-be-corrected condenser mirror 412, having the first test offset value and the second test offset value, may be loaded on the condenser stage 404.

After the to-be-corrected condenser mirror 412 is loaded on the condenser stage 404, an initialization process can be performed to position the to-be-corrected condenser mirror 412 at the initial position. When the to-be-corrected condenser mirror 412 is positioned at the initial position, under an ideal circumstances (no elastic deformation), the to-be-corrected condenser mirror 412 may collect the light emitted by a first light source and converge the collected light at the center of focus 220.

Further, the plurality of light sources 401 may sequentially emit light along the straight scanning direction 200. The to-be-corrected condenser mirror 412 may rotationally scan to collect the light emitted by the light sources 401. The to-be-corrected condenser mirror 412 may converge the collected light at the array detector 405 positioned at the center of focus 220 by reflection. The array detector 405 may be used to detect the light reflected by the to-be-corrected condenser mirror to obtain the detection spot.

In one embodiment, the plurality of light sources 401 may sequentially emit light along the straight scanning direction 200. After the first light source emits light, the second light source may emit light after lagging for a first period behind the first light source, . . . , and the $N^{th}$ (N≥3) light source may emit light after lagging for a first period behind the $(N-1)^{th}$ light source.

The plurality of light sources 401 may emit light sequentially along the straight scanning direction 200. The to-be-corrected condenser mirror 412 may rotationally scan. In one embodiment, the straight scanning direction 200 may be the positive direction of X axis, and the corresponding rotational scanning direction may be the clockwise direction.

In some other embodiments of the present disclosure, the straight scanning direction 200 may be the negative direction of X axis, and the corresponding rotational scanning direction may be the counter-clockwise direction.

As shown in FIG. 13, the structure of the array detector 405 is illustrated. The array detector 405 may include a standard center point 406. The standard center point 406 may overlap with the center of focus 220 (referring to FIG. 11). The array detector 405 may detect the light reflected by the to-be-corrected condenser mirror to obtain the detection spot 407. In one embodiment, for example, the detection spot 407 may have a circular shape.

In certain other embodiments of the present disclosure, the detection spot may also have other suitable shapes such as an oval shape. The detection spot 407 with an oval shape may be the result of several possible reasons. For example, if the illumination pulses of the light sources 401 (referring to FIG. 11) are considerably wide, the light reflected by the to-be-corrected condenser mirror 412, rotationally scanning, and converged at the array detector may form a detection spot with a stretched length along the straight scanning direction 200, as shown in FIG. 11. It may also be possible that certain deformation in the to-be-corrected condenser mirror 412 may cause optical aberration, which further causes the detection spot to have a stretched length along the straight scanning direction 200. The possible explanations of the detection spot with an oval shape should not affect the determination of the center of the detection spot.

Further, the position of the standard center point 406 and the position of the detection spot 407 may be compared to determine if the position of the standard center point 406 is different from the position of the detection spot 407. If the position of the standard center point 406 is the same as the position of the detection spot 407, the calibration process may end. If the position of the standard center point 406 is different from the position of the detection spot 407, the first test offset value and the second test offset value may be adjusted and the calibration process may be repeated from the step of illuminating the light sources sequentially. Steps of rotationally scanning the to-be-corrected condenser mirror 412 and the array detector detecting the light intensity can also be repeated until the position of the standard center point 406 is the same as the position of the detection spot 407. The adjustment can be obtained through re-grinding and coating multilayer reflective films on the reflective ellipsoidal surface of the to-be-corrected condenser mirror 412, or by bending the reflective ellipsoidal surface of the to-be-corrected condenser mirror 412.

To determine if the position of the standard center point 406 is different from the position of the detection spot 407, a distance D, between the center of the detection spot 407 and the center of the standard center point 406, may be obtained. The distance D may be used to determine if the position of the standard center point 406 is different from the position of the detection spot 407. The distance D may be obtained by the array detector 405 automatically, may be obtained manually, and/or may be obtained through any other suitable measuring tools or means.

The criterion to determine if the position of the standard center point 406 is the same as the position of the detection spot 407 may be the center of the standard center point 406 overlapping with the center of the detection spot 407, or the distance between the center of the standard center point 406 and the center of the detection spot 407 being less than 10 μm.

The criterion to determine if the position of the standard center point 406 is different from the position of the detection spot 407 may be whether the distance between the center of the standard center point 406 and the center of the detection spot 407 is greater than 10 μm.

In other embodiments of the present disclosure, to determine whether the position of the standard center point 406 is different from or is same as the position of the detection spot 407, any other suitable criteria may also be used.

When determining whether the position of the standard center point 406 is different from the position of the detection spot 407, the first test offset value and the second test offset value may be adjusted. Ways to adjust the first test offset value and the second test offset value may include increasing or decreasing the first test offset value and increasing or decreasing the second test offset value.

Specifically, increasing or decreasing the first test offset value and the second test offset value may include adding a suitable value to or subtracting a suitable value from the original first test offset value and/or the original second test offset value. The suitable value to be added or subtracted may be subjected to actual adjustment process.

After adjusting the first test offset value and/or the second test offset value, steps of sequentially illuminating the light sources, the to-be-corrected condenser mirror 412 rotationally scanning, and the array detector detecting the light intensity until the position of the obtained detection spot and the position of the standard center point are the same.

Figure 14:
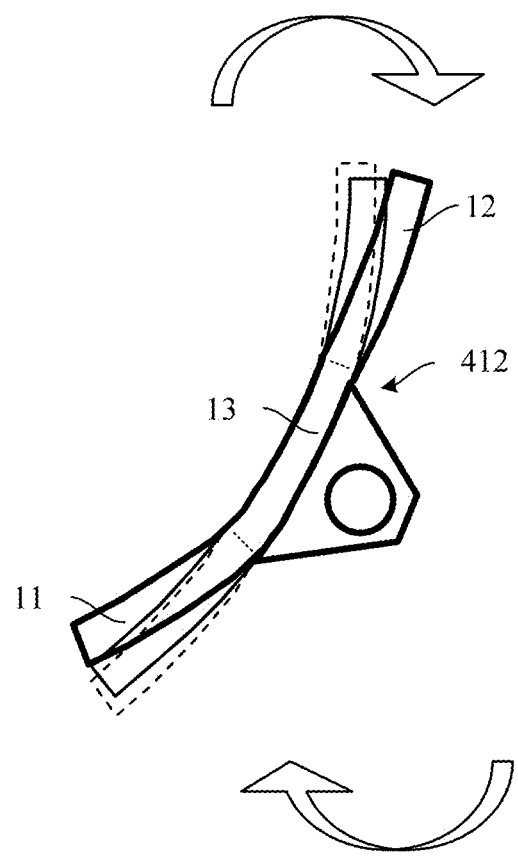
FIG. 14 illustrates exemplary positions of a condenser mirror during a rotation after a calibration process consistent with the disclosed embodiments of the present disclosure.

As shown in FIG. 14, the structures of the condenser mirror before and after calibration or correction at a certain position during a rotation are compared and illustrated. The structure of the condenser mirror 412 after calibration, with no elastic deformation, is drawn in dark solid lines. The structure of the condenser mirror 412 before calibration, under ideal conditions, is drawn in thin solid lines. The actual position of the condenser mirror 412 after calibration when rotationally scans along the clockwise direction, with elastic deformation, is drawn in dashed lines. As shown in FIG. 14, after calibration, the position of the condenser mirror 412 with elastic deformation when rotationally scans can be sufficiently close to or the same as the position of the condenser 412 under ideal conditions. By using the condenser mirror 412 after calibration in the EUV light source provided by the embodiments of the present disclosure, during the rotational scanning, the condenser mirror 412, after calibration, may converge the collected EUV light at the center of focus through reflection. The output power of the EUV light at the center of focus can be increased.

It should be noted that, for illustrative purposes, the dashed lines and the thin solid lines are separated. In practice, the dashed lines and the thin solid lines should overlap or have little deviation to each other.

Accordingly, the disclosed systems and methods may have several advantages.

For example, the disclosed EUV light source includes a droplet array, a laser source, and a condenser. The droplet array includes a plurality of nozzles arranged along a straight scanning direction. The plurality of nozzles is configured to eject droplets downward to a radiating position. The laser source is configured to generate laser beams and scan the laser beams along a straight line. The laser beams sequentially bombard the droplets at the radiating position. The droplets are bombarded by the laser beams (i.e., the first laser beam and the second laser beam) and form plasma, which radiates EUV light. The condenser includes a condenser mirror and a first driving mechanism connected with the condenser mirror. The first driving mechanism is configured to drive the rotational scanning of the condenser mirror, so that the condenser mirror collects the radiated EUV light and converge the collected EUV light at the center of focus. The condenser mirror has a reflective surface with an ellipsoidal surface. The condenser mirror includes a first side region and a second side region facing the first side region, where the first side region and the second side region are arranged along the direction of rotational scanning. The first side region of the condenser mirror has a first offset value towards the inner side of the ellipsoidal surface. The second side region of the condenser mirror has a second offset value towards the outer side of the ellipsoidal surface.

The droplet array includes a plurality of nozzles. The plurality of nozzles is configured to sequentially eject droplets downward to the radiating position to increase the supply of droplet within a unit of time. The ejection of droplets by different nozzles ensures two adjacent droplets are separated by a certain distance. Further, the laser beams scan along a straight scanning direction to sequentially bombard the droplets arriving at the radiating position and form EUV light. No droplets arriving at the radiating position is wasted. The EUV light formed may have increased intensity. Meanwhile, the condenser rotationally scans and simultaneously collet EUV light generated by bombardment of different droplets. The condenser converges the collected EUV light at the center of focus so that the output power of the EUV light at the center of focus increases. In addition, the first side region of the condenser mirror has a first offset value towards the inner side of the ellipsoidal surface, and the second side region of the condenser mirror has a second offset value towards the outer side of the ellipsoidal surface. When the condenser mirror rotationally scans, the first offset value may compensate the elastic deformation of the first side region along an outward direction of the ellipsoidal surface, and the second offset value may compensate the elastic deformation of the second side region along an inward direction of the ellipsoidal surface. Thus, during the scanning process, the condenser mirror may be kept an ideal ellipsoidal surface, and the condenser mirror may reflect the collected EUV light on the ellipsoidal surface and converge the collected EUV light at the same center of focus. The output power of the EUV light at the center of focus can be increased.

Further, the condenser mirror of the disclosed EUV light source includes an upper portion condenser mirror and a lower portion condenser mirror, separated from each other. The upper portion condenser mirror is positioned atop the lower portion condenser mirror. The upper portion condenser mirror may include at least two separated first sub-condenser mirrors, and the lower portion condenser mirror may include at least two separated sub-condenser mirrors. The first driving mechanism may include at least two first sub-driving mechanism and at least two second sub-driving mechanism. Each first sub-driving mechanism may be connected with a first sub-condenser mirror, and each second sub-driving mechanism may be connected with a second sub-condenser mirror, so that the first sub-condenser mirrors driving by the first sub-driving mechanism and the second sub-condenser mirrors driving by the second sub-driving mechanism may have decreased surface areas and weights. Driving forces may be transmitted to the parts of the first sub-condenser mirrors and the second sub-condenser mirrors with sufficiently fast speed. When starting to rotate, the starting time of each position of a first sub-condenser mirror and the starting time of each position of a second sub-condenser mirror may be the same, and no lagging in starting times occurs. The EUV light collected by the upper portion condenser mirror and the lower portion condenser mirror when rotationally scanning may be converged at the center of focus, the output power of the EUV light at the center of focus can be improved.

Further, the reflector includes a first reflector and a second reflector. The second driving mechanism includes a third sub-driving mechanism and a fourth sub-driving mechanism. The first reflector is positioned atop the second reflector. The first reflector reflects a portion of the laser beams to form the first laser beam. The third sub-driving mechanism is connected to the first reflector. The third sub-driving mechanism drives the first reflector to rotate so that the first laser beam scans along the straight scanning direction. The second reflector reflects another portion of the laser beams to form the second laser beam. The fourth sub-driving mechanism is connected with the second reflector. The fourth sub-driving mechanism drives the second reflector to rotate so that the second laser beam scans along the straight scanning direction. The first driving mechanism include first sub-driving mechanism and second sub-driving mechanism. The first sub-driving mechanism are connected to the upper portion condenser mirror to drive the upper portion condenser mirror to rotationally scan. The second sub-driving mechanism are connected to the lower portion condenser mirror to drive the lower portion condenser mirror to rotationally scan. Thus, in the present disclosure, the first laser beam and the second laser beam may alternately bombard adjacent rows of droplets. The upper portion condenser mirror collects the EUV light, generated from the bombardment of the corresponding droplets by the first laser beam, at the center of focus. The lower portion condenser mirror collects the EUV light, generated from the bombardment of the corresponding droplets by the second laser beam, at the center of focus. The output power of the EUV light at the center of focus can be further improved.

The present disclosure includes a calibration apparatus for the offset of the condenser mirror. Using the calibration apparatus, light sources are used to imitate radiated EUV light generated from the bombardments of droplets. An array detector is positioned at the center of focus to detect the light reflected by the condenser mirror and obtains a detection spot. The array detector is used to determine the difference between the position of the detection spot and the position of standard center point. Using the result of the detection, the offset values of the side regions of the condenser mirror can be corrected or compensated.

Further, the light sources are optical fibers. The optical fibers each has a diameter of about 2 μm to about 10 μm. Each one of the optical fibers may be used as a point light source to emit light and imitate the EUV light emitted from the bombardment of the droplets. The number of the optical fibers is equal to the number of nozzles. The distance between two adjacent optical fibers is equal to the distance between two adjacent nozzles. Thus, the optical fibers are suitable imitations of EUV light emitted from the bombardment of the droplets.

The present disclosure provides a method for correcting the offset values of the condenser mirror of the EUV light source. A first test offset value corresponding to the first side region of the to-be-corrected condenser mirror and a second test offset value corresponding to the second side region of the to-be-corrected condenser mirror can be set. The first test offset value may be an offset along an inward direction with respect to the ellipsoidal surface of the to-be-corrected condenser mirror. The second test offset value may be an offset along an outward direction with respect to the ellipsoidal surface of the to-be-corrected condenser mirror. Further, the plurality of light sources may emit light along the straight scanning direction, and the to-be-corrected condenser mirror rotationally scans to collect the light emitted by the light source. The to-be-corrected condenser mirror converges the collected light at the array detector at the center of focus through reflection. The array detector detects the light reflected by the to-be-corrected condenser mirror and obtains the detection spot. The array detector compares the position of the detection spot to the position of the standard center point to determine if a difference exists. If the position of the detection spot is the same as the position of the standard center point, the operation can be ended. If the position of the detection spot is different from the position of the standard center point, the first test offset value and the second offset value can be adjusted. Also, the first test offset value and the second test offset value can be adjusted, and steps of light sources emitting light sequentially, rotationally scanning the to-be-corrected condenser mirror, and the array detector detecting the light intensity can be repeated until the position of the standard center point is the same as the position of the detection spot. Thus, offset calibration values with higher accuracy can be obtained. Using the condenser mirror after calibration in the EUV light source, in the rotational scanning process, the generated EUV light can be better collected and converged at the center of focus. The output power of the EUV light at the center of focus can be improved.

It should be noted that, the number of laser beams generated by the laser is only exemplary. In practice, other numbers of laser beams may be formed to bombard a row of droplets. The specific arrangement of the number of laser beams, the number of reflectors, the corresponding division of condenser mirror, and the row of droplets each laser beam bombards may be according to the description in the disclosure and is not repeated herein.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:
1. A calibrating apparatus for correcting aberrations in an extreme ultraviolet (EUV) light source, comprising:
    an illuminant positioned at a radiating position, including a plurality of light sources arranged along a straight scanning direction, the plurality of light sources emitting light sequentially;
    a condenser stage configured to carry a to-be-corrected condenser mirror and drive the to-be-corrected condenser mirror to rotationally scan so that a reflective ellipsoidal surface of the to-be-corrected condenser mirror collects light emitted by the light sources and converge collected light at a center of focus through reflection; and
    an array detector positioned at the center of focus configured to detect light reflected by the to-be-corrected condenser mirror to obtain a detection spot, the array detector including a standard center point overlapping with the center of focus for comparing a position difference between the detection spot and the standard center point.

2. The calibrating apparatus according to claim 1, wherein the light sources are optical fibers, a top of each optical fiber including an inclined surface with a 45° inclination angle with respect to a horizontal direction, light transmitted in the optical fibers being reflected by the inclination surfaces too transmit to the reflective ellipsoidal surface of the condenser mirror.

3. The calibrating apparatus according to claim 2, wherein:
each optical fiber includes a core and a cladding surrounding the core, a diameter of the core being about 2 μm to about 10 μm;
a number of the optical fibers is equal to a number of nozzles in the apparatus, and a distance between two adjacent optical fibers is equal to a distance between two adjacent nozzles in the apparatus.

4. The calibrating apparatus according to claim 1, wherein:
the array detector is a charged coupled device (CCD), a complementary metal oxide semiconductor (CMOS) image sensor, or a combination of a CCD and a CMOS image sensor; and
the array detector includes a plurality of pixel units arranged in rows, a diameter of each pixel unit being less than a diameter of the detection spot.

5. The calibrating apparatus according to claim 1, wherein:
the condenser mirror includes one or more first side regions, one or more central regions, and one or more second side regions arranged along a rotational scanning direction, each central region being positioned between one first side region on one side and one second side region on another side, each first side region having a first offset value towards an inner direction of the reflective ellipsoidal surface, and each second side region having a first offset value towards an outer direction of the reflective ellipsoidal surface.

6. The calibrating apparatus according to claim 1, wherein:
during a rotational scanning process of the condenser mirror, the first offset value is used to compensate elastic deformation of a first side region along an outward direction with respect to the reflective ellipsoidal surface and the second offset value is used to compensate elastic deformation of a second side region along an inward direction with respect to the reflective ellipsoidal surface so that the reflective ellipsoidal surface of the condenser mirror is kept an ideal ellipsoidal shape during the rotational scanning process and collected EUV light is converged at a same center of focus by the condenser mirror.

7. A calibrating method for correcting aberrations in an extreme ultraviolet (EUV) light source, comprising:
providing a to-be-corrected condenser mirror with a reflective ellipsoidal surface, wherein the to-be-corrected condenser mirror includes one or more first side regions, one or more central regions, and one or more second side regions arranged according to a rotational scanning direction, a central region being arranged between a first side region on one side and a second side region on another side, and the second side region may be positioned on the other side of the central region;
providing an illuminant positioned at a radiating position of the EUV light source, the illuminant including a plurality of light source arranged along a straight scanning direction for emitting light to the reflective ellipsoidal surface of the to-be-corrected condenser mirror;
providing an array detector may at a center of focus configured to detect light reflected by the reflective ellipsoidal surface of the to-be-corrected condenser mirror, the array detector including a standard center point overlapping with the center of focus; and
setting a first test offset value corresponding to a first side region of the to-be-corrected condenser mirror and a second test offset value corresponding to a second side region of the to-be-corrected condenser mirror, wherein the first test offset value is an offset along an inward direction with respect to the reflective ellipsoidal surface of the to-be-corrected condenser mirror and the second test offset value is an offset along an outward direction with respect to the reflective ellipsoidal surface of the to-be-corrected condenser mirror.

8. The calibrating method according to claim 7, further including:
illuminating the plurality of light sources sequentially along the straight scanning direction;
rotationally scanning the to-be-corrected condenser mirror to collect light emitted by the light sources and converge collected light at the array detector positioned at the center of focus;
using the array detector to detect the light reflected by the to-be-corrected condenser mirror to obtain a detection spot; and
comparing a position of the detection spot with a position of the standard center point to determine if a difference exists, wherein if the position of the detection spot is same as the position of the standard center point, operation ends, if the position of the detection spot is different from the position of the standard center point, the first test offset value and the second test offset value are adjusted and the operation is repeated until the position of the detection spot is the same as the position of the standard center point.

9. The calibrating method according to claim 8, wherein a repetition of the operation includes illuminating the light sources sequentially, rotationally scanning the to-be-corrected condenser mirror and the array detector detecting the light intensity.

10. The calibrating method according to claim 8, wherein a criterion to determine if the position of the standard center point is same as the position of the detection spot includes a center of the standard center point overlapping with a center of the detection spot or a distance between the center of the standard center point and a center of the detection spot being less than 10 μm.

11. The calibrating method according to claim 8, wherein a criterion to determine if the position of the standard center point is different from the position of the detection spot includes a distance between a center of the standard center point and a center of the detection spot being greater than 10 μm.

12. The calibrating method according to claim 7, wherein a diameter of a pixel unit of the array detector is about 1 μm to about 10 μm, and a diameter of a detection spot is about 70 μm to about 100 μm.

13. The calibrating method according to claim 7, wherein:
the array detector is a charged coupled device (CCD), a complementary metal oxide semiconductor (CMOS) image sensor, or a combination of a CCD and a CMOS image sensor; and
the array detector includes a plurality of pixel units arranged in rows, a diameter of each pixel unit being less than a diameter of the detection spot.

14. The calibrating method according to claim 7, wherein:
the condenser mirror includes one or more first side regions, one or more central regions, and one or more second side regions arranged along a rotational scanning direction, each central region being positioned between one first side region on one side and one second side region on another side, each first side region having a first offset value towards an inner direction of the reflective ellipsoidal surface, and each second side region having a first offset value towards an outer direction of the reflective ellipsoidal surface.

* * * * *